US012596141B2

(12) United States Patent
Moore et al.

(10) Patent No.: US 12,596,141 B2
(45) Date of Patent: Apr. 7, 2026

(54) QUANTUM ELECTROMAGNETIC FIELD SENSOR

(71) Applicant: SRI International, Menlo Park, CA (US)

(72) Inventors: Kaitlin Moore, Skillman, NJ (US); Sterling Eduardo McBride, Princeton, NJ (US); Winston K. Chan, Princeton, NJ (US); Alan M. Braun, Princeton, NJ (US); Cale M. Gentry, Erie, CO (US)

(73) Assignee: SRI INTERNATIONAL, Menlo Park, CA (US)

( * ) Notice: Subject to any disclaimer, the term of this patent is extended or adjusted under 35 U.S.C. 154(b) by 58 days.

(21) Appl. No.: 18/577,054

(22) PCT Filed: Jul. 6, 2022

(86) PCT No.: PCT/US2022/073470
§ 371 (c)(1),
(2) Date: Jan. 5, 2024

(87) PCT Pub. No.: WO2023/283581
PCT Pub. Date: Jan. 12, 2023

(65) Prior Publication Data
US 2024/0310422 A1 Sep. 19, 2024

Related U.S. Application Data

(60) Provisional application No. 63/203,048, filed on Jul. 6, 2021.

(51) Int. Cl.
*G01R 29/08* (2006.01)

(52) U.S. Cl.
CPC ................................ *G01R 29/0885* (2013.01)

(58) Field of Classification Search
CPC . G01R 29/0885; G01R 29/0878; G01N 22/00
(Continued)

(56) References Cited

U.S. PATENT DOCUMENTS

| 7,400,207 | B2 | 7/2008 | Lipp et al. |
| 7,470,971 | B2 | 12/2008 | McBride |
| | | (Continued) | |

FOREIGN PATENT DOCUMENTS

| CN | 103616571 | A | 3/2014 |
| CN | 106501624 | A | 3/2017 |
| | (Continued) | | |

OTHER PUBLICATIONS

Hill, Abraham. "Quantum Defect Measurements for High Angular Momentum Rydberg States of Potassium." (2020). (Year: 2020).*

(Continued)

*Primary Examiner* — Christopher P McAndrew
(74) *Attorney, Agent, or Firm* — SHUMAKER & SIEFFERT, P.A.

(57) ABSTRACT

In one example, a sensor comprising a vapor cell including a vapor of alkali atoms is disclosed. The sensor further comprises a system configured to direct electromagnetic (EM) radiation of one or more frequencies into the vapor cell and incident on the vapor of alkali atoms. The EM radiation of one or more frequencies is configured to prepare the alkali atoms from a first quantum state to a Rydberg state. The alkali atoms prepared in the Rydberg state comprise an orbital angular momentum quantum number that is at least the number of quanta of the one or more frequencies. The sensor further comprises a detector configured to detect a response of the alkali atoms to incident electromagnetic radiation after the alkali atoms are prepared in the Rydberg state.

20 Claims, 15 Drawing Sheets

(58) Field of Classification Search

USPC ........................................................... 324/97

See application file for complete search history.

(56) References Cited

U.S. PATENT DOCUMENTS

| | | | |
|---|---|---|---|
| 7,807,509 B2 | 10/2010 | McBride | |
| 7,955,551 B2 | 6/2011 | McBride et al. | |
| 8,080,778 B2 | 12/2011 | McBride | |
| 8,299,860 B2 | 10/2012 | Youngner et al. | |
| 8,405,021 B2 | 3/2013 | Anderson et al. | |
| 8,415,612 B2 | 4/2013 | McBride et al. | |
| 10,774,220 B1 | 9/2020 | Roper et al. | |
| 10,802,066 B1 * | 10/2020 | Keaveney | G01R 29/10 |
| 2004/0227088 A1 | 11/2004 | Trotz et al. | |
| 2009/0289629 A1 | 11/2009 | Tuchman | |
| 2015/0048824 A1 | 2/2015 | Bohi et al. | |
| 2016/0363617 A1 * | 12/2016 | Anderson | G01R 29/0885 |
| 2019/0187198 A1 * | 6/2019 | Anderson | G01R 29/0878 |
| 2019/0310422 A1 | 10/2019 | Seyedi et al. | |
| 2020/0233025 A1 * | 7/2020 | Salim | G01R 29/0885 |
| 2020/0292606 A1 * | 9/2020 | Holloway | G01R 29/0892 |
| 2021/0048465 A1 | 2/2021 | Anderson et al. | |
| 2023/0049199 A1 | 2/2023 | Mcbride et al. | |
| 2023/0137266 A1 | 5/2023 | Mcbride et al. | |

FOREIGN PATENT DOCUMENTS

| | | |
|---|---|---|
| CN | 109324233 A | 2/2019 |
| CN | 110361604 A | 10/2019 |
| WO | 2019014330 A1 | 1/2019 |

OTHER PUBLICATIONS

"InGaAs PIN photodiodes", Hamamatsu, Retrieved from: https://www.hamamatsu.com/resources/pdf/ssd/g10899_series_kird1109e.pdf, Dec. 2017, 5 pp.

"New-Generation Terahertz Imagers", Terasense, Retrieved from: www.terasense.com, Accessed on: Jan. 29, 2020, 5 pp.

Anderson et al., "High-Resolution Antenna Near-Field Imaging and Sub-THz Measurements with a Small Atomic Vapor-Cell Sensing Element", 2018 11th Global Symposium on Millimeter Waves (GSMM), May 22, 2018, 3 pp.

Dhillon et al., "The 2017 terahertz science and technology roadmap", vol. 50, Journal of Physics D: Applied Physics, Jan. 4, 2017, 49 pp.

Downes et al., "Ultra-high-speed Terahertz Imaging using Atomic Vapour", arXiv:1903.01308v1, Mar. 15, 2019, 9 pp.

Fan et al., "Atom based RF electric field sensing", vol. 48, No. 20, Journal of Physics B: Atomic, Molecular and Optical Physics, Sep. 9, 2015, 16 pp.

Fan et al., "Sub-wavelength microwave electric field imaging using Rydberg atoms inside atomic vapor cells", Optic Letters, vol. 39, No. 10, Mar. 14, 2014, pp. 1-5.

Fesharaki et al., "Accurate theoretical and experimental characterization of optical grating coupler", vol. 24, No. 18, Nov. 5, 2016, 11 pp.

Hill, "Quantum Defect Measurements for High Angular Momentum Rydberg States of Potassium", Colby, Colby College, May 2020, 28 pp., Retrieved from the Internet on Aug. 31, 2022 from URL: https://digitalcommons.colby.edu/cgi/viewcontent.cgi?article=2003&context=honorstheses.

Holloway et al., "Broadband Rydberg Atom-Based Electric-Field Probe for SI-Traceable, Self-Calibrated Measurements", IEEE Transactions on Antennas and Propagation, vol. 62, No. 12, Dec. 2014, pp. 6169-6182.

Holloway et al., "Sub-Wavelength Imaging and Field Mapping via EIT and Autler-Townes Splitting in Rydberg Atoms", vol. 104, No. 24, Applied Physics Letters, arXiv:1404.0289v1, Apr. 1, 2014, 12 pp.

Hummon et al., "Photonic chip for laser stabilization to an atomic vapor X X with 10-11 instability", Optica, vol. 5, No. 4, Apr. 11, 2018, pp. 443-449.

International Preliminary Report on Patentability from International Application No. PCT/US2022/073470 dated Jan. 18, 2024, 8 pp.

International Search Report and Written Opinion of International Application No. PCT/US2022/073470 dated Sep. 29, 2022, 10 pp.

Iwaszczuk et al., "Terahertz radar cross section measurements", Optics Express, vol. 18, No. 25, Dec. 6, 2010, pp. 26399-26408.

Kline, "Flight Qualification of a Terahertz Imaging Camera as a CubeSat Payload", Thesis Naval Postgraduate School, Jun. 1, 2018, 125 pp.

Lui et al., "Video-rate Terahertz Interferometric and Synthetic Aperture Imaging", vol. 48, No. 19, Jun. 24, 2009, pp. 3788-3795.

Moore et al., "Measurement of Rb g-series quantum defect using two-photon microwave spectroscopy", arXiv:2004.11407v3, Jul. 29, 2020, 9 pp.

Office Action from U.S. Appl. No. 01/190,073 dated Mar. 11, 2024, 11 pp.

Simons et al., "Fiber-coupled vapor cell for a portable Rydberg atom-based radio frequency electric field sensor", Applied Optics, vol. 57, No. 22, Aug. 1, 2018, pp. 6456-6460.

Smith, "Theory and Design of Smith-Purcell Semiconductor Terahertz Sources", IEEE, Dec. 2013, 141 pp.

Thaicharoen et al., "Electromagnetically-induced transparency, absorption, and microwave field sensing in a Rb vapor cell with a three-color all-infrared laser system", arXiv:1905.09925v1, May 23, 2019, 9 pp.

Van Dijk et al., "Integrated InP Heterodyne Millimeter Wave Transmitter", vol. 26, No. 10, IEEE, Mar. 3, 2014, pp. 965-968.

Wade et al., "Real-Time Near-Field Terahertz Imaging with Atomic Optical Fluorescence", arXiv:1603.07107v2, Mar. 23, 2016, pp. 1-5.

WebElements, "Rubidium: properties of free atoms", Retrieved from: https://www.webelements.com/rubidium/atoms.html#:~:text=Rubidium%20atoms%20have%2037%20electrons,neutral%20rubidium%20is%20%5BKr%5D, Accessed on Dec. 21, 2020, 7 pp.

Williams, "Filling the THz gap—high power sources and applications", vol. 69, No. 2, Reports on Progress in Physics, Dec. 5, 2005, p. 301-326.

Notice of Allowance from U.S. Appl. No. 17/906,386 dated Jul. 19, 2024, 9 pp.

Response to Office Action dated Mar. 11, 2024 from U.S. Appl. No. 01/190,073, 9 pp.

* cited by examiner

700

702 — PREPARE ALKALI ATOMS IN A VAPOR CELL FROM A FIRST QUANTUM STATE TO A RYDBERG STATE VIA EM RADIATION OF ONE OR MORE FREQUENCIES

704 — DETECT A RESPONSE OF THE ALKALI ATOMS IN THE RYDBERG STATE TO INCIDENT EM RADIATION

706 — OUTPUT A SIGNAL PROPORTIONAL TO THE DETECTED RESPONSE

QUANTUM ELECTROMAGNETIC FIELD SENSOR

This application is a national phase entry of International Application PCT/US2022/073470, filed 6 Jul. 2022, which claims the benefit of U.S. Provisional Patent Application No. 63/203,048, filed 6 Jul. 2021, the entire contents of each of which is incorporated herein by reference.

TECHNICAL FIELD

This disclosure generally relates to electromagnetic sensors.

BACKGROUND

Currently, sensors for detecting low-frequency electric fields and/or electromagnetic (EM) radiation is typically done with antenna structures. As the signal of interest moves to lower frequencies, typical antenna structures get physically larger—this is well known and due to efficient antenna designs being linked to the wavelength of the signal of interest. This wavelength can get quite large as the frequencies move from the gigahertz (GHz) regime (approximately 30 cm) to the megahertz (MHz) regime, e.g., 10 MHz (30 meters). Limiting the size of classical antennas, for linear time-invariant systems, limits the available information bandwidth, a known phenomenon now known as the Chu-Harrington limit.

SUMMARY

In general, the current disclosure describes techniques and sensors for detecting electromagnetic (EM) radiation having frequencies in the megahertz (MHz) and gigahertz (GHz) ranges with a relatively small sized sensing element, e.g., a sensing volume that is less than the wavelength of the incoming EM radiation being sensed/detected (e.g., the signal-of-interest). In some examples, the techniques and sensors provide a high sensitivity to incident EM radiation having relatively low frequencies. In some examples, a vapor cell may operate as a transducer to convert EM radiation having frequencies in a first range to an EM radiation response having frequencies in a second range or to an ionization state of the atoms in the vapor cell. In some examples, compared to direct detection of EM radiation in the first range, electromagnetic radiation in the second frequency range or the ionization of the vapor atoms may be more discernable, have a higher signal-to-noise (SNR) ratio, may be less expensive to detect, may be detectable with a smaller and/or lighter apparatus, and have a higher sensitivity.

In some examples, a vapor cell array may include a plurality of vapor cells including alkali atoms. The alkali atoms may be prepared in a Rydberg state in which the alkali atoms are excited such that one or more electrons have a relatively low principal quantum number, e.g., n less than 200 ($n \leq 200$), while having a relatively high orbital angular momentum quantum number, e.g., $l \geq 3$. In some examples, preparation of the alkali atoms in a Rydberg state with a relatively low principal quantum number and a relatively high orbital angular momentum may be done via multiple excitations, e.g., via multiple quantum levels via relatively lower energy excitations.

Accordingly, the techniques may provide one or more technical advantages that realize at least one practical application. For example, the techniques may improve the sensitivity and signal to noise ratio (SNR) of a MHz/GHz electromagnetic radiation sensing/receiving system. The techniques may provide for a reduced size, weight, required power (SWaP), and cost of a MHz/GHz electromagnetic radiation sensing/receiving system.

In some examples, this disclosure describes a method comprising preparing alkali atoms in a vapor cell, via electromagnetic (EM) radiation of one or more frequencies, from a first quantum state to a Rydberg state, wherein the alkali atoms in the Rydberg state have an orbital angular momentum quantum number that is at least a number of quanta of the one or more frequencies, detecting a response of the alkali atoms in the Rydberg state to incident EM radiation, and outputting a signal proportional to the detected response.

In some examples, this disclosure describes a sensor including a vapor cell including a vapor of alkali atoms, a system configured to direct electromagnetic (EM) radiation of one or more frequencies into the vapor cell and incident on the vapor of alkali atoms, wherein the EM radiation of one or more frequencies is configured to prepare the alkali atoms from a first quantum state to a Rydberg state, wherein the alkali atoms prepared in the Rydberg state comprise an orbital angular momentum quantum number that is at least a number of quanta of the one or more frequencies, and a detector configured to detect a response of the alkali atoms to incident EM radiation after the alkali atoms are prepared in the Rydberg state.

In some examples, this disclosure describes a sensor including a vapor cell including a vapor of alkali atoms, a first set of optical elements configured to substantially collimate and direct a first electromagnetic (EM) radiation comprising visible light to be incident on at least a portion the alkali atoms of the vapor cell, a second set of optical elements configured to substantially collimate and direct a second EM radiation comprising visible or near infrared (NIR) light to be incident on at least a portion the alkali atoms of the vapor cell, a third set of optical elements configured to substantially collimate and direct a third EM radiation comprising visible light, NIR light, or EM radiation comprising a frequency that is at least 1 gigahertz (GHz) and less than 1 terahertz (THz) to be incident on at least a portion the alkali atoms of the vapor cell, a fourth set of optical elements configured to substantially collimate and direct a fourth EM radiation comprising visible light, NIR light, or EM radiation comprising a frequency that is at least 10 megahertz (MHz) and less than 100 GHz to be incident on at least a portion the alkali atoms of the vapor cell, and a detector configured to detect a response of the alkali atoms to incident EM radiation that is different from the first, second, third, and fourth EM radiations after the alkali atoms are prepared in the Rydberg state, wherein the first, second, third, and fourth EM radiations are configured to prepare at least a portion of the alkali atoms from a first quantum state to a Rydberg state, wherein the alkali atoms prepared in the Rydberg state comprise an orbital angular momentum quantum number is at least 3 ($l \geq 3$) and a principal quantum number less than 200 ($n \leq 200$).

The details of one or more examples of the techniques of this disclosure are set forth in the accompanying drawings and the description below. Other features, objects, and advantages of the techniques will be apparent from the description and drawings, and from the claims.

DETAILED DESCRIPTION

Figure 1:
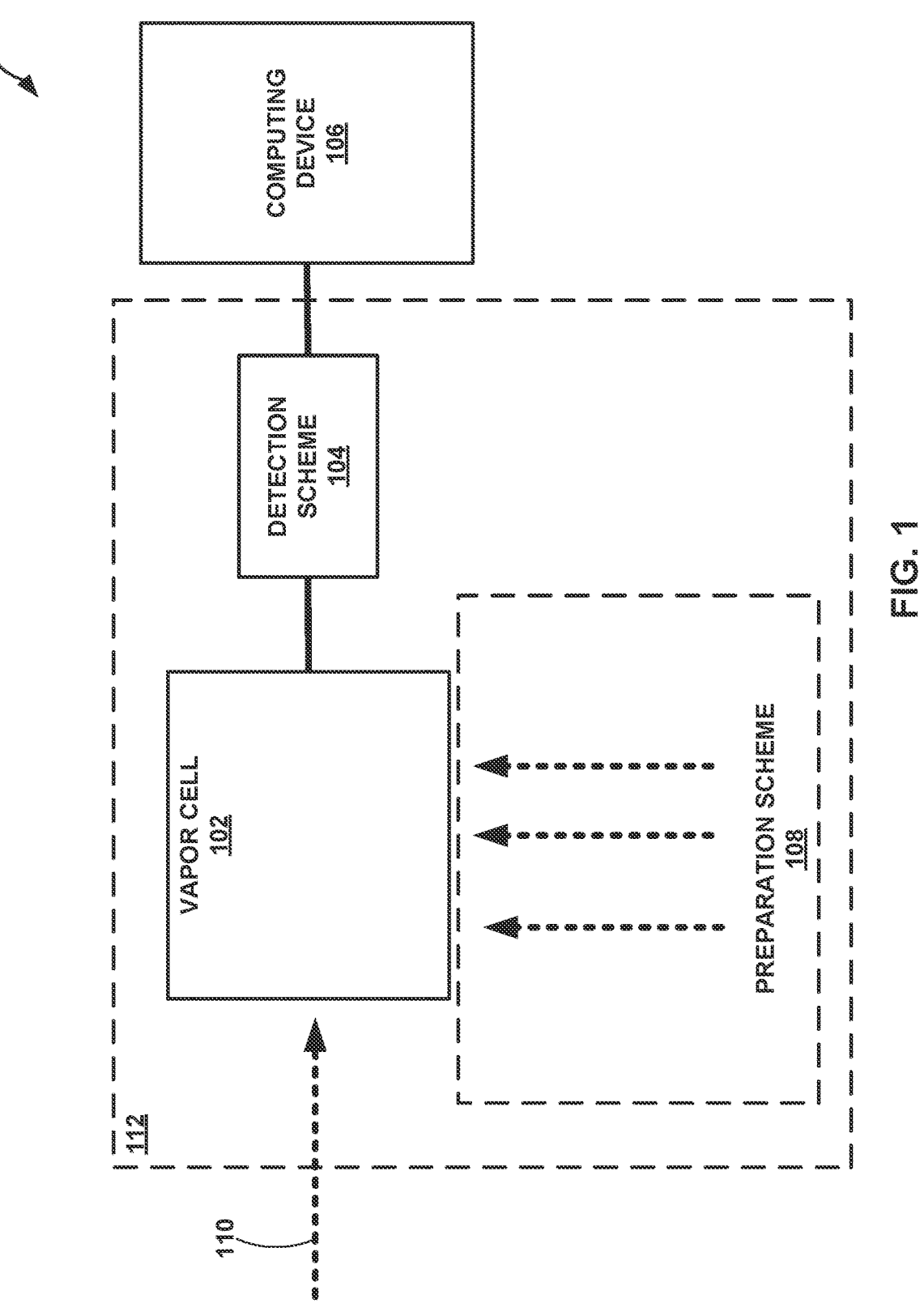
FIG. 1 is a cross-sectional block diagram illustrating an example EM radiation sensing system, in accordance with the techniques of the disclosure.

Detecting low-frequency electric fields and/or electromagnetic (EM) radiation, e.g., incident EM radiation, is typically done with antenna structures. As the signal of interest (e.g., incident EM radiation) moves to lower frequencies, typical antenna structures get physically larger due to efficient antenna designs being linked to the wavelength of the signal of interest. This wavelength can get quite large as the frequencies move from the gigahertz (GHz) regime (approximately 30 cm) to the megahertz (MHz) regime, e.g., 10 MHz (30 meters). Limiting the size of classical antennas, for linear time-invariant systems, limits the available information bandwidth, a known phenomenon now known as the Chu-Harrington limit.

"Quantum sensing" may use Rydberg atoms in millimeter-to-centimeter-scale vacuum cells to sense low frequency electric fields and/or EM radiation, breaking the Chu limit, and offering an efficient way to sense EM radiation in the MHz-GHz frequency range with a small footprint system. Rydberg atoms are highly excited atoms, where the difference in a quantum number (e.g., a principal quantum number, an orbital angular momentum quantum number which may be indicative of a transition between excitation levels) may be used to detect resonant frequencies, and a shift in a measured energy level is used to detect off-resonant frequencies. On-resonant detection is orders of magnitude more sensitive than off-resonant detection. Typical Rydberg experiments operate in the 10 GHz-100 GHz, as this is where the most accessible transitions lie (i.e., principal quantum number, $n=10$ s–$100$ s). Scaling quantum sensing systems using Rydberg atoms to the megahertz and/or tens of megahertz range implies principal quantum numbers much greater than 100 ($n>>100$), or in some cases ($n>>200$), for resonant detection and may not traditionally be feasible. At such high principal quantum numbers, the excited atoms may be very easily perturbed by external fields and atom-particle interactions, which can obscure the desired electric field and/or EM radiation detection.

In examples of the present disclosure, a sensor and sensing techniques include a vapor of alkali atoms prepared via multiple excitation levels (e.g., three or more excitation levels) to a Rydberg state having a relatively low principal number ($n \leq 200$) and a relatively high orbital angular momentum quantum number ($l \geq 3$). The atoms may be prepared to such a Rydberg state via multiple lower-energy transitions, as opposed to two-photon methods, e.g., two transitions to access a Rydberg state. Rydberg states having a low principal quantum number are advantageous over Rydberg states with higher principal quantum numbers because an atom in a Rydberg state having a low principal quantum number may reduce noise (e.g., may not be as easily perturbed by external fields and/or atom-particle interactions) relative to an atom in a Rydberg state having a high quantum number. A Rydberg state having a high angular momentum is advantageous because it has a higher sensitivity to lower frequencies (e.g., <10 MHz-1 GHz) with a reduced atom size due to the relatively lower principal quantum number. To attain sensitivity to a continuum of frequencies in this range, a technique of Stark tuning may be employed, wherein the Rydberg atomic resonance is tuned via an applied DC electric field, typically across tens of megahertz frequencies to gigahertz frequencies. Preparing alkali atoms to a Rydberg state via multiple stages/quantum levels with three or more optical photons allows for use of a Doppler-free interrogation technique, wherein the optical photons of the receiver element is designed in a velocity-insensitive configuration (e.g., insensitive to the velocity of an alkali atom or an average velocity of an ensemble of alkali atoms), wherein the k-vectors of the optical interrogation beams (defined as the inverse wavelength and direction of the beams) are balanced at relative angles, so the total Doppler shift k·v equals zero along all orthogonal directions. Such a configuration for the preparation lasers increases sensitivity by addressing a wide range of velocity classes at zero detuning, increasing the Rydberg density and thus signal sensitivity by orders of magnitude, as well as providing a well-defined interrogation region in the center of the sensing element, reducing effects due to RF field nonuniformity throughout the cell, as well as atom-wall interactions.

In some examples, a sensor includes a vapor cell including a vapor of alkali atoms and a system configured to direct EM radiation of one or more frequencies into the vapor cell and incident on the vapor of alkali atoms, e.g., separate EM radiations, or beams, having the same or different frequencies. The EM radiation, or beams, of one or more frequencies may be configured to correspond to resonant or near-resonant transitions of the alkali atoms between a first quantum state (or energy state) and a second quantum state, e.g., a Rydberg state. The EM radiation of one or more frequencies may include multiple frequencies configured to be resonant or near-resonant between multiple intermediate quantum states of the alkali atoms between the first quantum state and the second (Rydberg) quantum state. In other words, the EM radiation may include multiple beams having frequencies configured to be resonant or near-resonant with one or more intermediate quantum states in a "chain" from the first quantum state to the Rydberg quantum state. The alkali atoms prepared in the second quantum state, e.g., the Rydberg state, may have an orbital angular momentum quantum number that is equal to the number of quanta (photons) used to prepare the alkali atoms, e.g., from the first to the second quantum states via one or more intermediate quantum states. The sensor may include a detector configured to detect a response of the alkali atoms to incident EM radiation after the alkali atoms are prepared in the Rydberg state, e.g., from the first quantum state to the second quantum state.

FIG. 1 is a cross-sectional block diagram illustrating an example EM radiation sensing system 100, in accordance with the techniques of the disclosure. In the example shown, sensing system 100 includes sensor 112 and computing device 106. Sensor 112 includes a vapor cell 102, a detection scheme 104, and a preparation scheme 108. EM radiation sensing system 100 and/or sensor 112 may be configured to sense incident EM radiation 110.

Vapor cell 102 may include a vapor of atoms, for example, alkali atoms. In some examples, vapor cell 102 may be configured to be a transducer to convert incident EM radiation 110, e.g., electromagnetic radiation having frequencies in a first frequency range, to electromagnetic radiation having frequencies in a second range or to an ionization state of the atoms in the vapor cell. For example, each vapor cell 102 may transduce, or convert, incident EM radiation 110 having frequencies in the MHz-GHz frequency range to optical/visible light frequencies.

Detection scheme 104 may include one or more detectors, circuits, meters, and the like, configured to detect a response of the alkali atoms to incident EM radiation after the alkali atoms are prepared in the Rydberg state. For example, detection scheme 104 may include an optical detector configured to detect an amount of EM probe light and capture an absorption spectrum of the alkali atoms as a function of detuning of the frequency of the EM probe beam frequency and indicating/quantifying electromagnetic induced transparency (EIT) of the vapor of alkali atoms, as further described below with respect to FIG. 5 and FIGS. 6A-6D. As another example, detection scheme 104 may include selectively ionizing atoms prepared in the Rydberg state via a high (e.g., hundreds of volts/cm) direct current (DC) electric field and detection scheme 104 may include electrodes within vapor cell 102 electrically connected an electrical circuit and configured to collect free charges resulting from the selective ionization, as further described below with respect to FIG. 5. As another example, detection scheme 104 may include a detector configured to detect an amount of fluorescent light emitted by the alkali atoms via decay from the Rydberg state to a lower quantum energy state, as further described below with respect to FIG. 6. Detection scheme 104 may be configured to detect response of the alkali atoms, prepared in a Rydberg state, to incident EM radiation and convert the detected response to one or more signals, e.g., analog and/or digital signals.

Computing device 106 may be configured to receive analog and/or digital signals from detection scheme 104. For example, computing device 106 may be configured to process and record and/or store received signals from detection scheme 104, and may be configured to store and/or output raw and/or processed data indicative of incident EM radiation 110, e.g., an amount and/or spectral content of EM radiation 110. Computing device 106 may include one or more processors, memory, and interface components.

For example, the one or more processors of computing device 106 may include any one or more of processing circuitry, a microprocessor, a controller, a digital signal processor (DSP), an application specific integrated circuit (ASIC), a field-programmable gate array (FPGA), or equivalent discrete or integrated logic circuitry. The functions attributed to processors described herein may be provided by processing circuitry of a hardware device, e.g., as supported by software and/or firmware.

In some examples, memory of computing device 106 may include any volatile or non-volatile media, such as a random-access memory (RAM), read only memory (ROM), non-volatile RAM (NVRAM), electrically erasable programmable ROM (EEPROM), flash memory, and the like. The memory may be a storage device or other non-transitory medium and may be used by processing circuitry to, for example, store information related to sensing system 100, such as information relating to vapor cell 102, detection scheme 104, preparation scheme 108, and incident EM radiation 110. In some examples, the memory may store information or previously received data from detection scheme 104 for later retrieval. In some examples, the memory may store settings, determined values, and/or calculated values for later retrieval.

In some examples, interface components of computing device 106 may include output devices, such as a display, sound card, video graphics adapter card, speaker, presence-sensitive screen, one or more USB interfaces, video and/or audio output interfaces, or any other type of device capable of generating tactile, audio, video, or other output. A display device may use technologies including liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating tactile, audio, and/or visual output.

In some examples, computing device 106 may be integrated with sensing system 100, e.g., integrated with one or more of vapor cell 102, detection scheme 104, and preparation scheme 108. In other examples, computing device 106 may be an external device, e.g., a computing device separate from sensing system 100 and configured to communicate with sensing system 100.

Preparation scheme 108 may include one or more EM radiation frequencies configured to prepare alkali atoms within vapor cell 102 to a second, higher quantum energy state, e.g., a Rydberg state, from a first quantum energy state, which may be a ground state of the vapor of alkali atoms. In some examples, preparation scheme 108 may include any hardware suitable for preparing the atoms to be in the Rydberg state. For example, preparation scheme may include a plurality of EM radiation sources and physical/optical elements configured to direct EM radiation from the one or more EM radiation sources. EM radiation sources may include optical sources such as a laser, a RF radiation source such as an antenna, or any suitable EM radiation source. Physical/optical elements may include lenses, mirrors, diffraction gratings, windows, filters, waveguides, fibers, or any physical/optical element for directing and/or shaping (e.g., beam shaping) EM radiation from a radiation source to be incident on the alkali atoms within vapor cell 102.

In some examples, preparation scheme 108 may include a plurality of EM radiation frequencies arranged to be incident on alkali atoms within vapor cell 102. In the example shown, preparation scheme 108 includes three EM radiation "beams" each including at least one EM radiation frequency different from each other and directed into vapor cell 102 and may be referred to as a "three-photon" preparation scheme 108. In some examples, preparation scheme 108 may include more than three EM radiation frequencies. In some examples, the plurality of EM radiation frequencies of preparation scheme 108 may be configured to prepare alkali atoms within vapor cell 102 to be in a Rydberg state via one or more intermediate quantum energy states, e.g., as further illustrated and described below with respect to FIG. 2. In some examples, preparation scheme 108 may be configured to prepare the alkali atoms within vapor cell 102 to be in a Rydberg state with an orbital angular momentum quantum number e, that is at least the number of quanta/frequencies of the plurality of EM frequencies, e.g., $l \geq 3$ in the example shown. In some examples, preparation scheme 108 may be configured to prepare the alkali atoms within vapor cell 102 with a principal quantum number n that is less than or equal to 200, e.g., $n \leq 200$.

Figure 2:
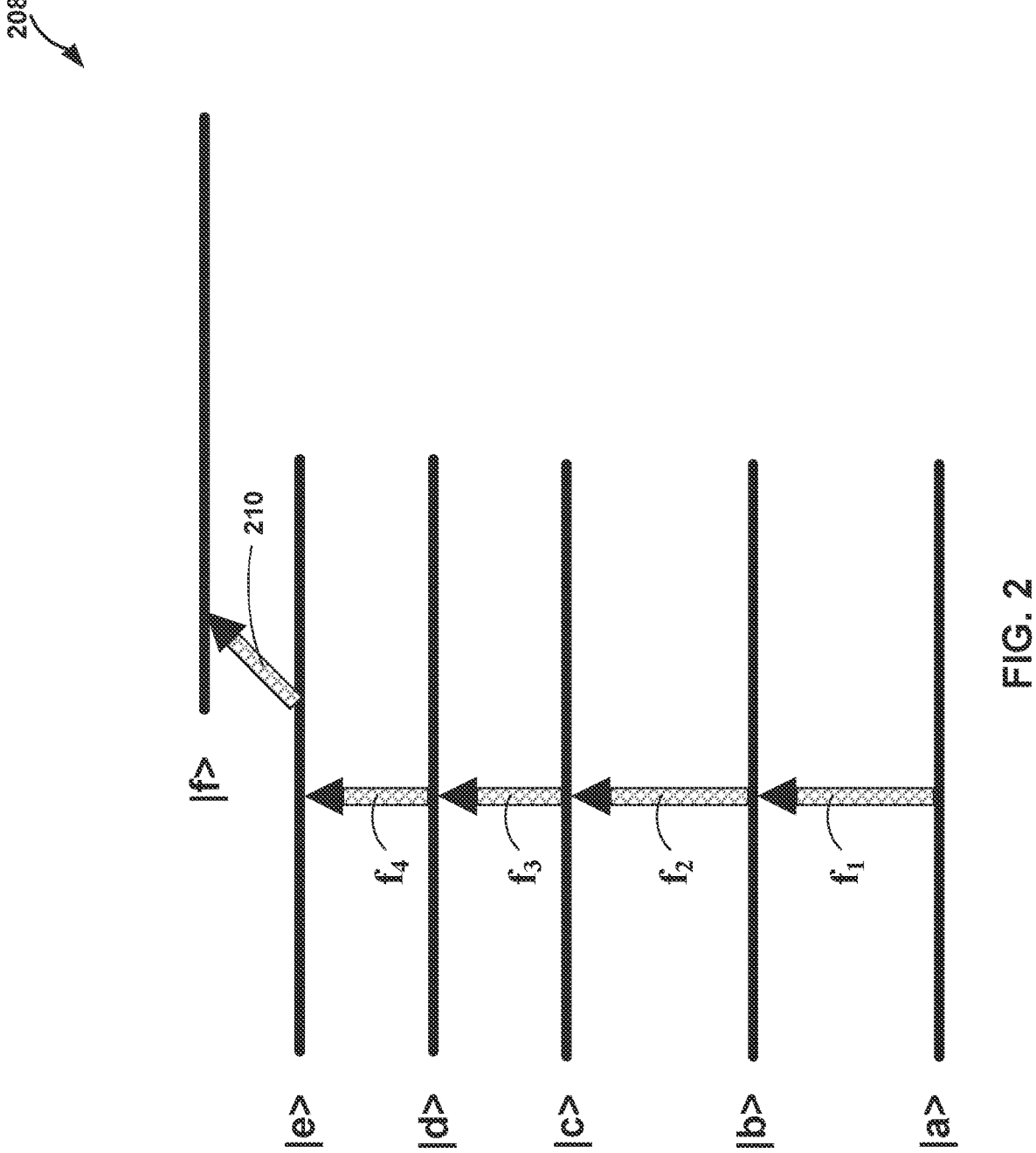
FIG. 2 is an illustration of an example energy diagram of an alkali atom including at least one Rydberg state, in accordance with the techniques of the disclosure.

FIG. 2 is an illustration of an example energy diagram 208 of an alkali atom including at least one Rydberg state, in accordance with the techniques of the disclosure. In some examples, energy diagram 208 may correspond to an example preparation scheme for preparing alkali atoms to be in a Rydberg state, such as preparations scheme 108 of FIG. 1. In some example, the alkali atom prepared via energy diagram 208 in the Rydberg state, e.g., quantum energy state $|e\rangle$ in the example shown, may have a relatively low quantum number $(n \leq 200)$ and a relatively high orbital angular momentum $(l \geq 3)$. For example, a sensor may be configured to prepare alkali atoms in a Rydberg state with an orbital angular momentum corresponding to an orbital angular momentum quantum number that is at least at least 3 $(l \geq 3)$.

Energy diagram 208 illustrates a "four-photon" excitation scheme or preparation scheme. In the example shown, atoms may be excited from a ground state $|a\rangle$ to a Rydberg state $|e\rangle$ via multiple transitions between multiple quantum states and/or energy states $|b\rangle$, $|c\rangle$, and $|d\rangle$. In the examples shown, incident EM radiation 210 may excite and/or perturb the atoms in the Rydberg state $|e\rangle$ to another state $|f\rangle$, which may be detectable via the methods described herein, e.g., via probe beam (EIT), selective ionization of the atoms via a direct current (DC) electric field, and/or fluorescence, as described in FIGS. 6-8. The atoms may be excited to each subsequent level, e.g., $|b\rangle$ through $|e\rangle$, via incident EM radiation of a specific frequency, e.g., frequencies $f_1$, $f_2$, $f_3$, $f_4$ (each of which may also be referred to as a "photon" of the "four-photon" scheme in reference to the energy of each photon being directly proportional to its frequency $f_1$, $f_2$, $f_3$, or $f_4$, although it is to be understood that multiple atoms may be excited from one energy state to another energy state via multiple photons of the same energy). In some examples, exciting the atoms from a lower quantum/energy state, e.g., ground state $|a\rangle$, to Rydberg state $|e\rangle$ via multiple transitions, e.g., three or more, may result in atoms in the Rydberg state with a lower quantum number n and a higher orbital angular momentum quantum number l in relation to exciting the atoms via a single and/or two-photon transition. Although energy diagram 208 illustrates a four-photon scheme, in some examples the methods and techniques disclosed herein may utilize a different number of quantum energy levels, e.g., a three-photon scheme (e.g., three EM radiation frequencies), or more than four photons (e.g., more than four EM radiation frequencies).

In one example, energy diagram 208 may be an "all-optical" excitation scheme (e.g., preparation scheme 108) in which the EM radiation for each of $f_1$, $f_2$, $f_3$, $f_4$ are all in the visible or infrared (IR) range. At least one electron of a rubidium atom may be excited from the ground state $|a\rangle$, which may be a $|5S_{1/2}\rangle$ energy state, to a second energy state (e.g., alternatively referred to as a first intermediate state), $|b\rangle$, which may be a $|5P_{3/2}\rangle$ energy state, via 780 nanometer (nm) EM radiation (e.g., visible and/or near infrared (NIR) light) having a frequency $f_1$ of about 384.349 THz. Hereinafter, excitation of at least one electron of an atom may alternatively be stated as "the atom may be excited," e.g., to a particular energy state, although it is understood that it is one or more electrons of one or more atoms which may be excited to a different energy state. The rubidium atom may further be excited from the second energy state $|b\rangle$ to a third energy state $|c\rangle$, which may be a $|4D_{5/2}\rangle$ energy state via 1.52937 NIR light, e.g., corresponding to EM radiation having a frequency $f_2$ of about 196.023 THz. The rubidium atom may further be excited from the third energy state $|c\rangle$ to a fourth energy state $|d\rangle$, which may be a $|4F_{7/2}\rangle$ energy state via 1.34464 NIR light, e.g., corresponding to EM radiation having a frequency $f_3$ of about 222.954 THz. The rubidium atom may further be excited from the fourth energy state $|d\rangle$ to a fifth, e.g., Rydberg energy state $|e\rangle$, which may be any one of a plurality of $|nG\rangle$ Rydberg energy states via a tunable NIR/IR light, e.g., EM radiation having a tunable frequency $f_4$. In some examples, alkali atoms excited to the fifth Rydberg energy state $|e\rangle$ comprising one of an $|nG\rangle$ Rydberg energy state may have an orbital angular momentum number e >4. In some examples, alkali atoms excited to the fifth Rydberg energy state $|e\rangle$ comprising one of an $|nG\rangle$ Rydberg energy state may only have an orbital angular momentum number $l=4$. In some example, n may be an integer ranging from 4 to 200, e.g., $4 \leq n \leq 200$. In some examples, incident EM radiation 210 may be resonant with, e.g., able to further excite the rubidium atom to, at least one of a plurality of energy states $|f>$, which may be any of $|(n+i)H>$ or $|(n+i)F>$ Rydberg energy states, where i may be zero or any integer such that $4 \leq n+i$ for a F state and $6 \leq n+i$ for a H state. For example, incident EM radiation 210 may excite the rubidium atom to an energy state with the same quantum number n, e.g., $i=0$, or a different quantum number, e.g., $i \neq 0$, as the Rydberg energy state $|e>$.

In some examples, incident EM radiation 210 may comprise a plurality of frequencies which may excite one or more rubidium atoms to one or more $|(n+i)H>$ or $|(n+i)F>$ Rydberg energy states, and for which one or more detection schemes (e.g., probe beam (EIT), electronic (selective ionization), or fluorescence further described below) may be configured to detect. In other words, energy diagram 208 may be a preparations scheme 108 enabling a sensor 100 to sense a plurality of incident EM radiation 210 frequencies and amounts, e.g., concurrently or over a predetermined period of time.

In some examples, tunable EM radiation $f_4$ may be tuned to a plurality of frequencies, e.g., via scanning over a period of time, such that one or more rubidium atoms may be excited to a plurality of Rydberg $|nG>$ energy states, each of which may be resonance with one or more frequencies of incident EM radiation 210, e.g., allowing EM radiation 210 to further excite the one or more rubidium atoms to one or more $|(n+i)H>$ or $|(n+i)F>$ energy states. In other words, energy diagram 208 may be a preparation scheme 108 enabling a sensor 100 to scan a tunable preparation EM radiation frequency, e.g., $f_4$, and thereby scan and sense a plurality of incident EM radiation 210 frequencies and amounts, e.g., to sense at least a portion of the spectral content of EM radiation 210 via the one or more detection schemes further described below.

In some examples, tunable EM radiation $f_4$ may be about 205.337 THz, e.g., about 1460 nm IR light, and may be tunable across about ±10 nm, e.g., from about 1450 nm to about 1470 nm or 203.94 THz $<f_4<206.753$ THz. Table 1 includes a plurality of example tunable EM radiation $f_4$ frequencies and corresponding $|e>$ Rydberg energy states, each of which may be configured to sense incident EM radiation 210 including an on-resonant frequency with the corresponding $|(n+i)H>$ energy state (the frequencies shown may be approximate). In other examples, energy diagram 208 may include any other suitable $|e>$ Rydberg energy state with a quantum number n less than or equal to 200 and orbital angular momentum quantum number greater than or equal to 3 and prepared via any other suitable $f_4$ frequencies and configured to sense other EM radiation 210 frequencies on-resonant with any other suitable $|f>$ energy state (e.g., any other suitable $|(n+i)H>$ or $|(n+i)F>$ energy state) not necessarily shown in Table 1.

TABLE 1

| $f_4$ | n | $|e>$ | 208 | $|f>$ |
|---|---|---|---|---|
| 1.46411 μm | 40 | $|40G_{9/2}>$ | 189 MHz | $|40H_{9/2}>$ |
| 1.45884 μm | 50 | $|50G_{9/2}>$ | 97 MHz | $|50H_{9/2}>$ |
| 1.45599 μm | 60 | $|60G_{9/2}>$ | 56 MHz | $|60H_{9/2}>$ |
| 1.45427 μm | 70 | $|70G_{9/2}>$ | 35 MHz | $|70H_{9/2}>$ |
| 1.45316 μm | 80 | $|80G_{9/2}>$ | 24 MHz | $|80H_{9/2}>$ |

In some examples, an all-optical excitation scheme of the current example may use other intermediate energy levels. For example, the all-optical scheme may use a $|5P_{1/2}>$ energy state as the second $|b>$ energy state and still result in one of the same Rydberg $|nG>$ energy states as the above all-optical examples but via one or more different four-photon combinations of visible/NIR/IR EM radiation frequencies $f_1$, $f_2$, $f_3$, $f_4$.

In some examples, energy diagram 208 may be an excitation/preparation scheme using other alkali atoms besides and/or in addition to rubidium. For example, vapor cell 102 may comprise a vapor of cesium atoms, and preparation scheme 108 may comprise any of the example energy diagrams 208 described herein.

In another example, energy diagram 208 may be a "mixed optical-RF" excitation scheme in which the EM radiation for each of $f_1$, $f_2$, $f_3$, $f_4$ may be a combination of visible/NIR/IR and RF frequencies. For example, at least one electron of a rubidium atom may be excited from the ground state $|a>$, which may be a $|5S_{1/2}>$ energy state, to a second energy state $|b>$, which may be a $15P_{3/2}>$ energy state, via 780 nm ($f_1$ of about 384.349 THz) EM radiation as described above. The rubidium atom may further be excited from the second energy state $|b>$ to a third energy state $|c>$, which may be a $|(n+j)D_{5/2}>$ energy state via tunable visible light, e.g., EM radiation having a tunable frequency $f_2$, where j indicates an integer such that the $|(n+j)D>$ energy state may be prepared at a different quantum number (n+j) than a fourth energy state $|d>$, which may be a $|nF_{7/2}>$ energy state. In other words, j may be an integer and not equal to zero, $j \neq 0$. In some examples, $f_2$ may be a tunable frequency corresponding to 480 nm±10 nm, e.g., 637.856 THz $<f_2<666.205$ THz, such that the rubidium atom is excited to an appropriate $|(n+j)D>$ energy state that, in conjunction with $f_3$ and $f_4$ photons (e.g., EM radiations), prepare the rubidium atom in a suitable Rydberg $|nG>$ energy state which may be on-resonant with incident EM radiation 210, as described above. For example, the rubidium atom may be further excited by static RF photons, e.g., from the third $|(n+j)D>$ energy state to a fourth $|d>$ energy state which may be a $|nF_{7/2}>$ energy state via EM radiation $f_3$ on the order of 1 GHz-1 THz, and from the fourth $|nF_{7/2}>$ energy state to a fifth (e.g., Rydberg) $|e>$ energy state which may be a $|nG>$ energy state via EM radiation $f_4$ on the order of 10 MHz-100 GHz.

In some examples, mixed optical-RF energy diagram 208 may be a preparation scheme 108 enabling a sensor 100 to sense a plurality of incident EM radiation 210 frequencies and amounts, e.g., concurrently or over a predetermined period of time, such as described above with reference to example all-optical energy diagrams. In some examples, mixed optical-RF energy diagram 208 may be a preparation scheme 108 enabling a sensor 100 to scan a tunable preparation EM radiation frequency, e.g., $f_2$, and thereby scan and sense a plurality of incident EM radiation 210 frequencies and amounts, as described above with reference to example all-optical energy diagrams. In some examples, a mixed optical-RF excitation scheme of the current example may use other intermediate energy levels, as described above with reference to example all-optical energy diagrams. For example, the mixed optical-RF excitation scheme may use a $|5P_{1/2}>$ energy state as the second $|b>$ energy state and still result in one of the same Rydberg $|nG>$ energy states as the above all-optical examples but via one or more different four-photon combinations of visible/NIR/IR and RF EM radiation frequencies $f_1$, $f_2$, $f_3$, $f_4$.

In another mixed optical-RF example, energy diagram 208 may be an excitation scheme in which the EM radiation for each of $f_1$, $f_2$, $f_3$, $f_4$ may be a different combination of visible/NIR/IR and RF frequencies from the example just above. For example, at least one electron of a rubidium atom may be excited from the ground state $|a>$, which may be a $|5S_{1/2}>$ energy state, to a second energy state $|b>$, which may be a $|5P_{3/2}>$ energy state, via 780 nm ($f_1$ of about 384.349 THz) EM radiation as described above. The rubidium atom may further be excited from the second energy state $|b>$ to a third energy state $|c>$, which may be a $|5P_{3/2}>$ energy state via 776 nm visible/NIR light, e.g., corresponding to EM radiation having a frequency $f_2$ of about 386.33 THz. The rubidium atom may further be excited from the third energy state $|c>$ to a fourth energy state $|c>$, which may be a $|nF_{7/2}>$ energy state via tunable NIR/IR light, e.g., EM radiation having a tunable frequency $f_3$. In some examples, $f_3$ may be a tunable frequency corresponding to 1260 nm±10 nm, e.g., 236.057 THz $<f_3<239.834$ THz, such that the rubidium atom is excited to a suitable Rydberg $|nG>$ energy state in conjunction with the $f_4$ photon which may be on-resonant with incident EM radiation 210, as described above. For example, the rubidium atom may be further excited by a static $f_4$ RF photon on the order of 10 MHz-100 GHz from the fourth $|d>$ energy state to a fifth (e.g., Rydberg) $|e>$ energy state which may be a $|nG>$ energy state.

In some examples, such a mixed optical-RF energy diagram 208 may be a preparation scheme 108 enabling a sensor 100 to sense a plurality of incident EM radiation 210 frequencies and amounts, e.g., concurrently or over a predetermined period of time, such as described above with reference to example all-optical energy diagrams. In some examples, such a mixed optical-RF energy diagram 208 may be a preparation scheme 108 enabling a sensor 100 to scan a tunable preparation EM radiation frequency, e.g., $f_2$, and thereby scan and sense a plurality of incident EM radiation 210 frequencies and amounts, as described above with reference to example all-optical energy diagrams. In some examples, such a mixed optical-RF excitation scheme of the current example may use other intermediate energy levels, as described above with reference to example all-optical energy diagrams. For example, the mixed optical-RF excitation scheme may use a $|5P_{1/2}>$ energy state as the second $|b>$ energy state and still result in one of the same Rydberg $|nG>$ energy states as the above all-optical examples but via one or more different four-photon combinations of visible/NIR/IR and RF EM radiation frequencies $f_1$, $f_2$, $f_3$, $f_4$. In other words, the mixed optical-RF excitation scheme may prepare the alkali atoms to be in one of the same Rydberg $|nG>$ energy states as the all-optical examples above, but via a different "path" of intermediate states $|b>$ through $|d>$.

Figure 3:
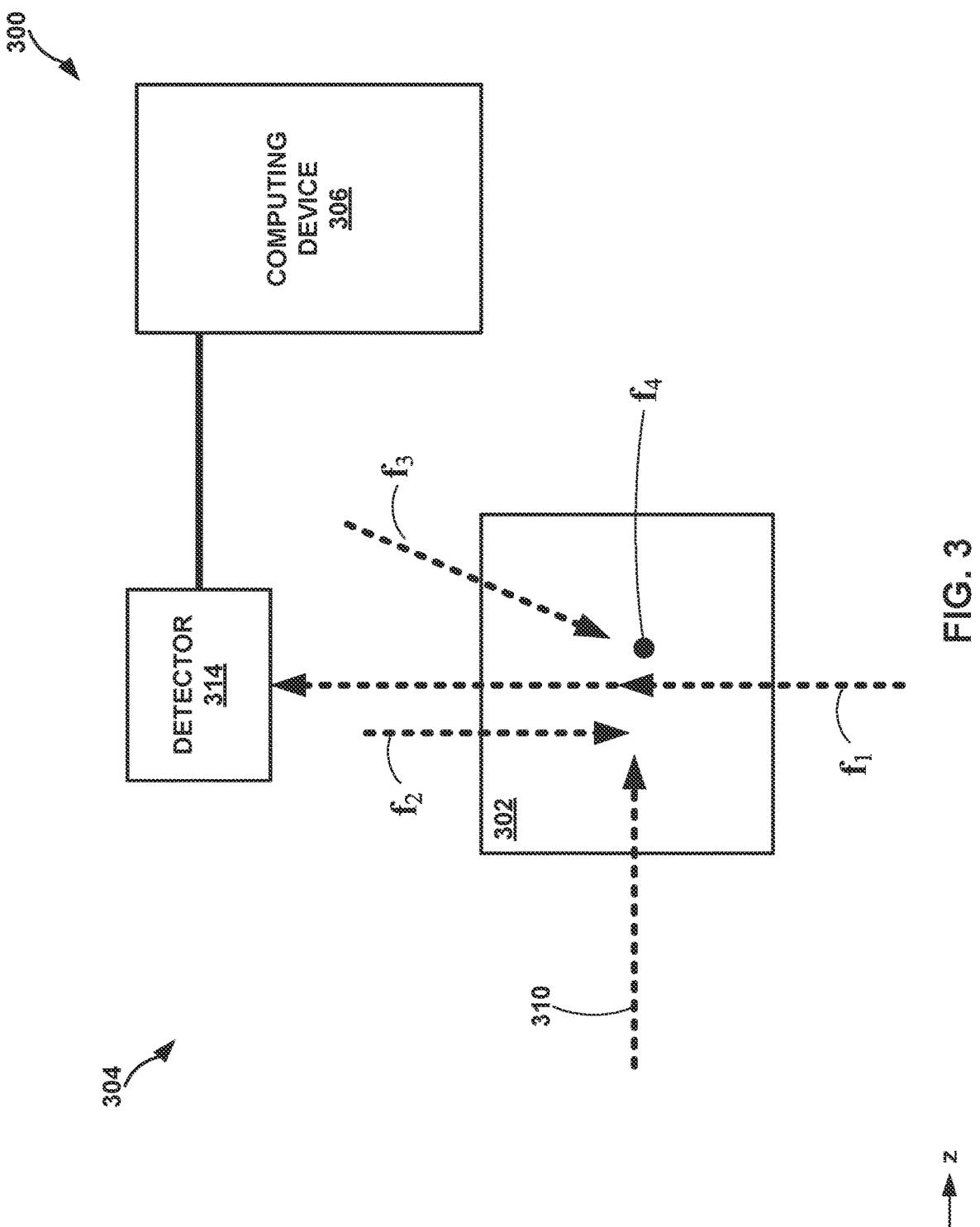
FIG. 3 is a cross-sectional block diagram illustrating an example EM radiation sensing system including a probe beam detection scheme, in accordance with the techniques of the disclosure.

FIGS. 3-6 illustrate example detection schemes which may comprise and/or be used in conjunction with an EM radiation sensing system, e.g., example detection schemes 104 of sensing system 100 of FIG. 1. FIG. 3 is a cross-sectional block diagram illustrating an example EM radiation sensing system 300 including a probe beam $f_1$ detection scheme 304 in accordance with the techniques of the disclosure, and FIGS. 4A-4D are example plots of probe beam transmission through a vapor cell of the sensing system of FIG. 3 as a function of probe beam frequency for alkali atoms prepared in example energy states in accordance with the techniques of the disclosure. In the examples shown below in FIGS. 4A-4D, the vertical scale of each of plots 402-408 are relative to the peak height of plot 402 of FIG. 4A. FIGS. 3 and 4A-4B are described together below.

In the example shown in FIG. 3, sensing system 300 includes vapor cell 302 which may correspond to vapor cell 102 of FIG. 1, detection scheme 304, computing device 306 which may correspond to computing device 106 of FIG. 1, a preparation scheme including EM radiations $f_1$ and $f_2$. In the example shown, sensing system 300 may be configured to sense and/or record incident EM radiation 310. In some examples, the preparation scheme may further include additional preparation EM radiations, e.g., $f_3$ and/or $f_4$, which may be configured to be directed into vapor cell 302 in the x-direction (and are not shown for clarity of illustration).

In the example shown, detection scheme 304 operates in conjunction with the preparation scheme and includes detector 314, EM radiations $f_1$, $f_2$, $f_3$ and $f_4$ ($f_4$ is illustrated as propagating in the x-y plane), and any associated optical or RF components configured to direct EM radiations $f_1$, $f_2$, $f_3$, $f_4$ from their corresponding EM radiation sources and to be incident on one or more alkali atoms within vapor cell 302. In the example shown, EM radiation $f_1$ may be referred to as probe beam $f_1$ and is configured to be directed to detector 314 through vapor cell 302. Correspondingly, detector 314 is configured and positioned so as to sense/detect/capture probe beam $f_1$. For example, detector 314 may be a visible, NIR, and/or IR detector configured to sense visible, NIR, and/or IR light and probe beam $f_1$ may be visible, NIR, and/or IR light. In some examples, probe beam $f_1$ may be 780 nm EM radiation, e.g., $f_1$ of FIG. 2.

Detection scheme 304 may be configured to a current energy state of the alkali atoms within vapor cell 302 based on the transmission of probe beam $f_1$. For example, alkali atoms within vapor cell 302 prepared via the preparation scheme may exhibit electromagnetic induced transparency (EIT). In the presence of a strong on-resonant coupling EM radiation, e.g., EM radiation of $f_1$, $f_2$, $f_3$, $f_4$ having frequencies closely matched to the energy gap between respective quantum energy states, e.g., $|b>$, $|c>$, $|d>$, and $|e>$ of FIG. 2, the index of refraction of the vapor of alkali atoms of vapor cell 304 may be modified for EM radiation frequencies near the frequency of probe beam $f_1$ and resulting in an EIT "window" of increased transmission in the transmission spectrum of the alkali atoms near that frequency, e.g., $f_1$. Detuning (e.g., from the strong on-resonance frequency) of at least one of the preparation EM radiations $f_1$, $f_2$, $f_3$, and/or $f_4$ may change the index of refraction of the alkali atoms and consequently the transmission of probe beam $f_1$. A plot of the transmission of as a function of detuning of at least one of $f_1$, $f_2$, $f_3$, and/or $f_4$ may include features characteristic and/or indicative of the energy state of the alkali atoms prepared to be in that state via the preparation scheme. Incident EM radiation 410, which may correspond to incident EM radiation 110 and/or 210 of FIGS. 1 and 2 respectively, may perturb the energy state of the alkali atoms (e.g., the energy state of at least one electron of the alkali atoms), for example, to a different energy state. A plot of the transmission as a function of detuning may be characteristic of the different energy state, and the amount and/or spectral content of the incident EM radiation 310 may then be inferred via one or more features of the transmission as a function of detuning, e.g., as sensed/detected/measured via detector 314.

Figures 4A, 4B, 4C, 4D:
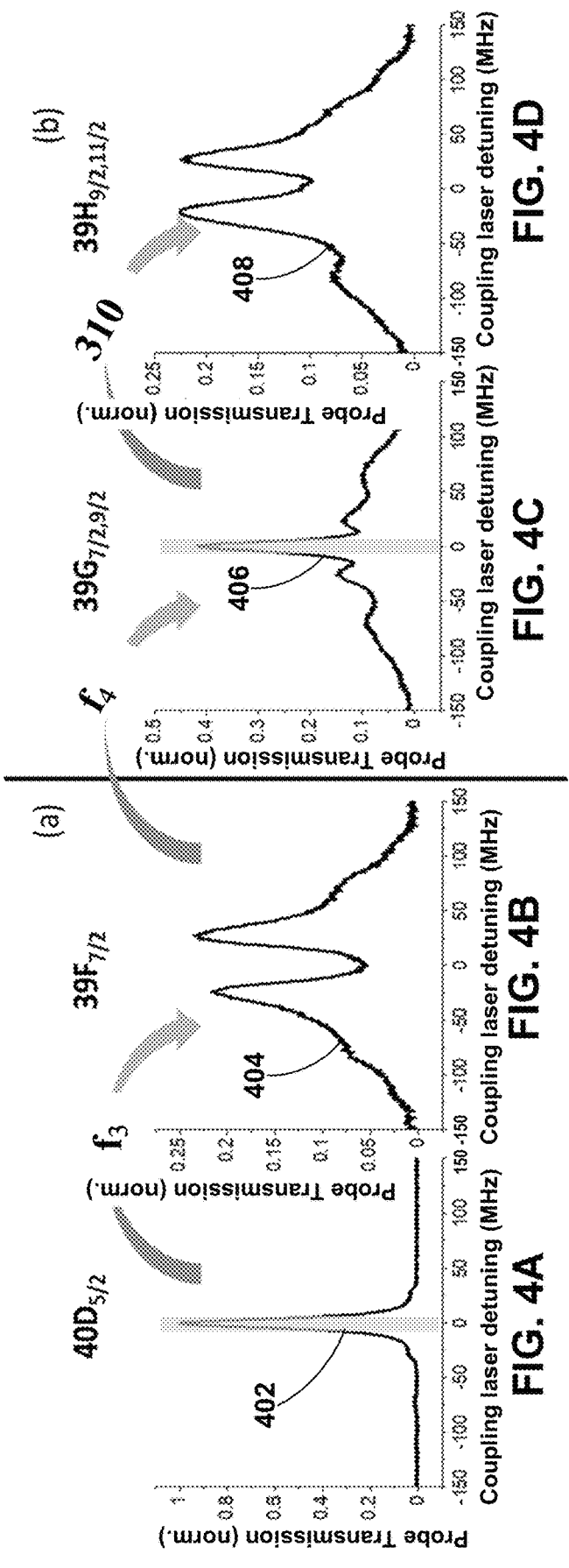
FIG. 4A is an example plot of probe beam transmission through a vapor cell of the sensing system of FIG. 3 as a function of probe beam frequency for alkali atoms prepared in an example energy state, in accordance with the techniques of the disclosure.
FIG. 4B is an example plot of probe beam transmission through a vapor cell of the sensing system of FIG. 3 as a function of probe beam frequency for alkali atoms prepared in another example energy state, in accordance with the techniques of the disclosure.
FIG. 4C is an example plot of probe beam transmission through a vapor cell of the sensing system of FIG. 3 as a function of probe beam frequency for alkali atoms prepared in another example energy state, in accordance with the techniques of the disclosure.
FIG. 4D is an example plot of probe beam transmission through a vapor cell of the sensing system of FIG. 3 as a function of probe beam frequency for alkali atoms prepared in another example energy state, in accordance with the techniques of the disclosure.

For example, plot 402 of FIG. 4A illustrates the transmission of probe beam $f_1$ as a function of detuning the frequency of at least one of $f_1$ or $f_2$ of a two-photon preparation scheme. Probe beam $f_1$ may correspond to 780 nm EM radiation and EM radiation $f_2$ (also referred to as a "coupling beam") may be tunable and in the visible/NIR/IR light frequency range. Plot 402 is a transmission plot of probe beam $f_1$ as a function of detuning of one of probe beam $f_1$ or coupling beam $f_2$ by +150 MHz, showing the on-resonance EIT window centered at 0 MHz detuning, and may be indicative of alkali atoms prepared to be in a $|40D_{5/2}>$ Rydberg energy state. Perturbation (e.g., excitation) of at least a portion of the population of alkali atoms prepared in the $|40D_{5/2}>$ Rydberg energy state may occur via incident EM radiation 310, however, lower frequency incident EM radiation 310 in the MHz to low GHz frequency ranges may be very difficult to detect for alkali atoms prepared via such a two-photon scheme. Incident EM radiation 310 of lower frequencies, e.g., under 30 GHz, perturb energy states having high quantum numbers, e.g., n>>100 and corresponding to very large outer electron shell diameters, and which may be very easily further perturbed by external fields and atom-particle interactions thereby obscuring the desired electric incident EM radiation 310 response, e.g., transmission plot. In other words, energy levels having lower quantum numbers, and therefore being less susceptible to external fields and atom-particle interactions, are not accessible and/or quantum mechanically allowed from Rydberg states reachable via two-photon preparation schemes.

To sense/detect a response of alkali atoms prepared in a Rydberg state to incident EM radiation 310 having lower frequencies, the alkali atoms may be prepared in higher orbital-angular momentum Rydberg states (e.g., F, G electron shells) via a preparation scheme or "path" including relatively lower quantum number energy states (and corresponding smaller electron shell diameters) that are not as easily further perturbed by external fields and atom-particle interactions. For example, the all-optical and mixed optical-RF preparation schemes of FIG. 2 allow sensing systems 100, 300 to sense/detect EM radiation 110, 310 having lower frequencies.

Plot 404 of FIG. 4B illustrates the transmission of probe beam $f_1$ as a function of detuning the frequency of at least one of $f_1$, $f_2$, or $f_3$ of a three-photon preparation scheme, e.g., as detected by detector 314, and may be indicative of alkali atoms prepared to a $|39F_{7/2}>$ Rydberg energy state. For example, the preparation scheme may be a mixed optical-RF preparation scheme described above with the following preparation scheme: probe beam $f_1$ is about 780 nm visible light configured to excite alkali atoms to a $5P_{3/2}>$ energy state, $f_2$ is tunable 480 nm±10 nm visible light configured to further excite alkali atoms to a $|(n+j)D>$ energy state, e.g., a $|40D_{5/2}>$ Rydberg energy state, and $f_3$ is about 37 GHz RF EM radiation configured to further excite the alkali atoms to the $|39F_{7/2}>$ Rydberg energy state. Plot 404 is the transmission plot of probe beam $f_1$ as a function of ±150 MHz detuning of $f_2$ and is indicative of the alkali atoms prepared to the $139F_{7/2}>$ Rydberg energy state.

Additionally and/or alternatively, plot 404 illustrates the transmission of probe beam $f_1$ as a function of detuning of at least one of $f_1$ or $f_2$ of a two-photon preparation scheme and $f_3$ may be considered the EM radiation of interest being detected, e.g., incident EM radiation 310. For example, $f_1$ and $f_2$ may be as just described above, e.g., configured to excite alkali atoms to the $140D_{5/2}>$ Rydberg energy state, and incident EM radiation 310 may be about 37 GHz RF EM radiation. Detector 314 may capture plot 404, and sensing system may determine that at least a portion of the alkali atoms prepared to the $140D_{5/2}>$ Rydberg energy state via the two-photon preparation scheme may have been perturbed/excited to the $|39F_{7/2}>$ Rydberg energy state based on one or more features of plot 404 (e.g., the strength, frequencies, widths of the double peaks and/or any other suitable features of plot 404) and infer an amount and spectral content of incident EM radiation 310, e.g., that incident EM radiation 310 comprises 37 GHz RF EM radiation.

Plot 406 of FIG. 4C illustrates the transmission of probe beam $f_1$ as a function of detuning the frequency of at least one of $f_1$, $f_2$, $f_3$, or $f_4$ of a four-photon preparation scheme, e.g., as detected by detector 314, and may be indicative of alkali atoms prepared to one of $|39G_{7/2,9/2}>$ Rydberg energy states. For example, the preparation scheme may be a mixed optical-RF preparation scheme described above with the following preparation scheme: probe beam $f_1$ is about 780 nm visible light configured to excite alkali atoms to a $|5P_{3/2}>$ energy state, $f_2$ is tunable 480 nm±10 nm visible light configured to further excite alkali atoms to a $|(n+j)D>$ energy state, e.g., a $|40D_{5/2}>$ Rydberg energy state, $f_3$ is about 37 GHz RF EM radiation configured to further excite the alkali atoms to the $139F_{7/2}>$ Rydberg energy state, and $f_4$ is about 1.38 GHz RF EM radiation configured to further excite the alkali atoms to at least one of the $|39G_{7/2,9/2}>$ Rydberg energy states. Plot 406 may illustrate a detection scheme 304, in conjunction with a preparation scheme configured to excite alkali atoms to a Rydberg energy state with a relatively low principal quantum number n≤200 and a relatively high orbital angular momentum quantum number l≥3 (e.g., a Rydberg energy state with relatively high orbital angular momentum), configured to determine an amount and/or spectral content of incident EM radiation in a relatively low MHz-GHz frequency range via the above described optical readout scheme, e.g., via probe beam $f_1$.

For example, plot 408 illustrates the transmission of probe beam $f_1$ as a function of ±150 MHz detuning of $f_2$. Detector 314 may capture plot 408, and sensing system may determine that at least a portion of the alkali atoms prepared to at least one of the $|39G_{7/2,9/2}>$ Rydberg energy states via the four-photon preparation scheme may have been perturbed/excited to at least one of $|39H_{9/2,11/2}>$ Rydberg energy states based on one or more features of plot 408 (e.g., the strength, frequencies, widths of the double peaks and/or any other suitable features of plot 408) and infer an amount and spectral content of incident EM radiation 310, e.g., that incident EM radiation 310 comprises about 250 MHz RF EM radiation.

In other words, incident EM radiation 310 may perturb the EIT of the alkali atoms in vapor cell 302, and detection scheme 304 may comprise an optical probe beam and optical detector configured to detect/capture one or more features of the EIT of the alkali atoms, e.g., in conjunction with a three-photon, four-photon, or more than four-photon alkali atom preparation scheme. System 300 may determine an amount and/or spectral content of the incident EM radiation 310 based on the one or more features of the EIT of the alkali atoms, and may be configured to determine EM radiation 310 comprising relatively lower EM frequencies, e.g., in the MHz-GHz frequency ranges. In some examples, probe beam $f_1$ may be at any angle relative to a surface of vapor cell 302 suitable for measurement. In some examples, the peak amplitudes of any of plots 402-408 may be controlled and/or manipulated via Rabi rates. In some examples, the widths and/or linewidths of plots 402-408 may be unaffected by the orbital angular momentum (e.g., e) of the corresponding Rydberg energy state.

Detector 314 may be configured to detect electromagnetic radiation, for example, infrared and/or visible light. Detector 314 may be large-bandgap solid-state visible wavelength detectors configured to operate at without cooling, e.g., at room temperature. For example, detector 314 may be a charge-coupled device (CCD), a metal-oxide-semiconductor based detector such as a complementary metal-oxide-semiconductor (CMOS) array or N-type metal-oxide-semiconductor (NMOS) detector, a PIN photodetector or a balanced photoreceiver. Detector 314 may be configured to detect probe light $f_1$ and may be configured to output one or more signals proportional to the detected probe light $f_1$. For example, detector 314 may be configured to output analog and/or digital signals representing a transmission of probe light $f_1$ as a function of detuning, such as any of plots 402-408. Detector 314 may include any suitable imaging optics, such as, but not limited to, a lens, a 1D or 2D lens array, a mirror and/or mirror array with or without optical power, one or more diffraction gratings, one or more optical fibers, e.g., for injecting probe light $f_1$ into vapor cell 302 and/or collecting probe light $f_1$ after having transmitted through vapor cell 302, stackable focusing optics, and the like. In some examples, imaging optics are configured to direct and/or focus probe light $f_1$ onto one or more optical detecting elements of detector 314.

Figure 5:
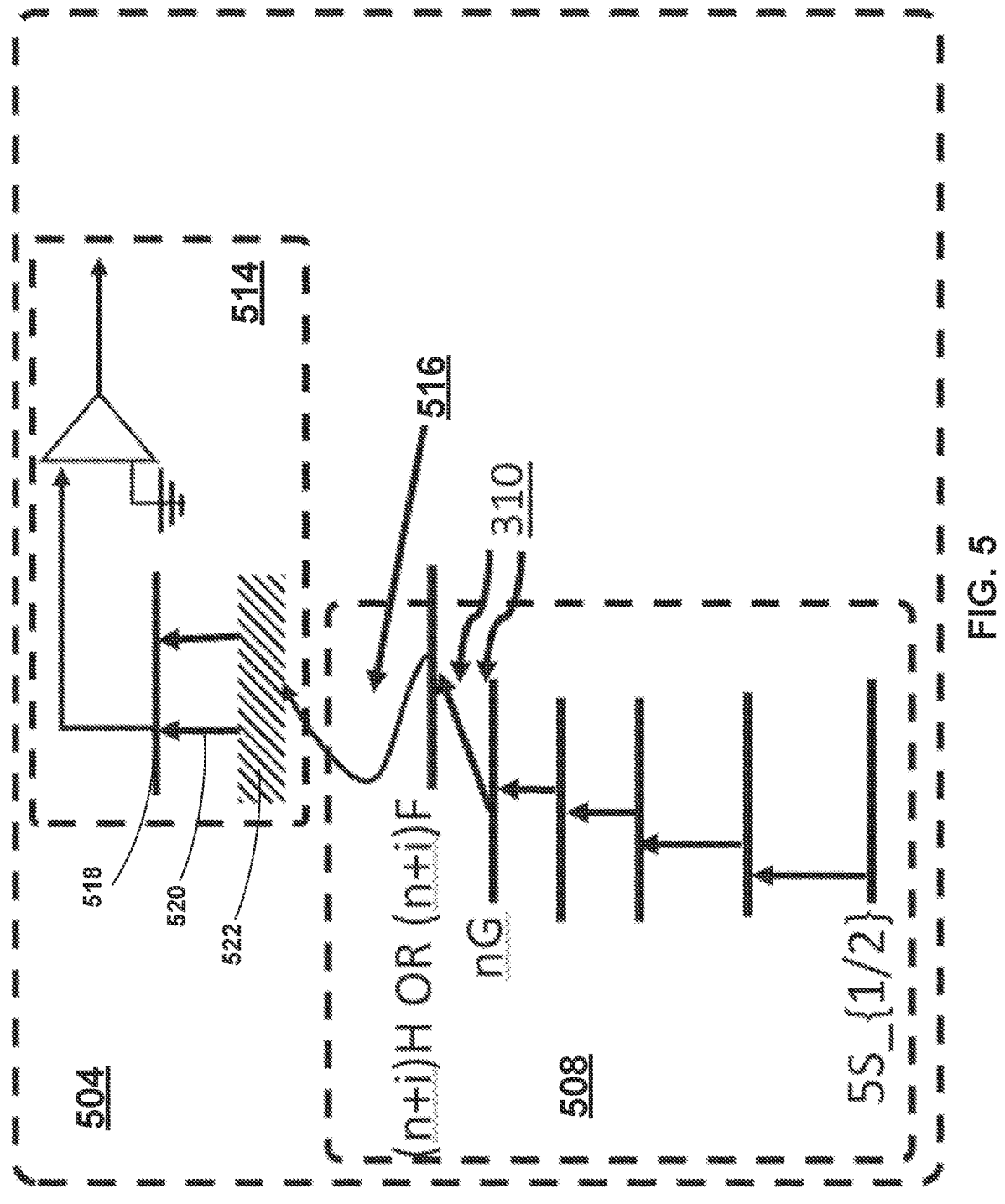
FIG. 5 is a schematic illustration of an example electronic detection scheme, in accordance with the techniques of the disclosure.

FIG. 5 is a schematic illustration of an example electronic detection scheme 504, in accordance with the techniques of the disclosure. Electronic detection scheme 504 may be used, for example, as a detection scheme 104 of sensing systems 100 or as an alternative or additional detection scheme to detection scheme 304.

In the example shown in FIG. 5, electronic detection scheme 504 includes preparation scheme 508, circuit 514, and DC electric field 516. Preparation scheme 508 may be substantially similar to any of preparation schemes 108, 208, and/or the three-photon or more than three-photon preparation schemes described with reference to FIGS. 3 and 4A-4B. In the example shown, preparation scheme 508 is a four-photon preparation scheme configured to prepare alkali atoms to one or more |nG> Rydberg energy states. In the example shown, incident EM radiation 310 may further excite the alkali atoms to one or more |(n+i)H> or |(n+i)F> Rydberg energy states.

DC electric field 516 may comprise an electric field greater than 10 V/cm, greater than 100 V/cm, or greater than 1000 V/cm. DC electric field 516 may be applied and/or provided to the alkali atoms within vapor cell 302 via one or more electrodes (not shown).

In some examples, the alkali atoms within vapor cell 302 may be ionized by DC electric field 516, resulting in free charges/electrons 520 within the vapor of alkali atoms 522. The free charge may be collected via one or more electrodes 518 disposed within vapor cell 302, e.g., which may be substantially similar to electrodes of electrode surfaces 812, illustrated and described below with reference to sensor 800 of FIG. 8. In some examples, electrodes 518 may be electrically connected to a low-noise current detector and/or a multi-channel plate.

In some examples, the number of free charges of the alkali atoms in vapor cell 302 may depend on the energy state of the alkali atoms. In other words, the ionization amount and/or ionization state of the alkali atoms or vapor of alkali atoms within DC electric field 516 may be proportional to the amount of alkali atoms in an energy state (and/or the strength of DC electric field 516). For example, the number of free charges in the presence of the same DC electric field 516 may be different from alkali atoms in one or more of |nG> Rydberg energy states than at least a portion of those alkali atoms excited to one or more of |(n+i)H> or |(n+i)F> Rydberg energy states, e.g., via incident EM radiation 310. As such, a current of a circuit including electrodes 518 may be perturbed and/or changed based on the free charges collected by electrodes 518, and may be indicative of an energy state of the alkali atoms. For example, a current of the circuit corresponding to alkali atoms in a |(n+i)H> or |(n+i)F> Rydberg energy state and in the presence of incident EM radiation 310 and DC electric field 516 may be different and/or distinguishable from a current of the circuit corresponding to alkali atoms in a |nG> Rydberg energy state in the presence of DC electric field 516 but without incident EM radiation 310. As such, sensing system 300 may determine the presence, amount, and/or spectral content of EM radiation based on a detected current of detection scheme 504, applied DC electric field 516, and preparation scheme 508, e.g., via inferring the energy state of the alkali atoms within DC electric field 516 based on the detected circuit current. In some examples, readout electrodes 518 may be the same the electrodes that provide DC electric field 516.

In some examples, electrodes 518 may be thin-film conductors, such as titanium, and coated on an inside surface (e.g., glass) of vapor cell 302 and may have a relatively high RF transparency, e.g., a high transparency for EM radiation such as incident EM radiation 310. In some examples, a separation between multiple electrodes 518 (e.g., two electrodes 518) may be less than 5 millimeters (mm), e.g., so as to allow for application of DC electric field 516 while still allowing space/volume for preparation scheme beams, e.g., not obstructing optical beams of the preparation scheme. In some examples, the height and width dimensions of each of the electrodes 518 may be perpendicular to the separation direction between the electrodes 518 and may be at least twice the separation distance, e.g., so as to reduce and/or eliminate interference and/or fringing effects of DC electric field 516.

Figure 6:
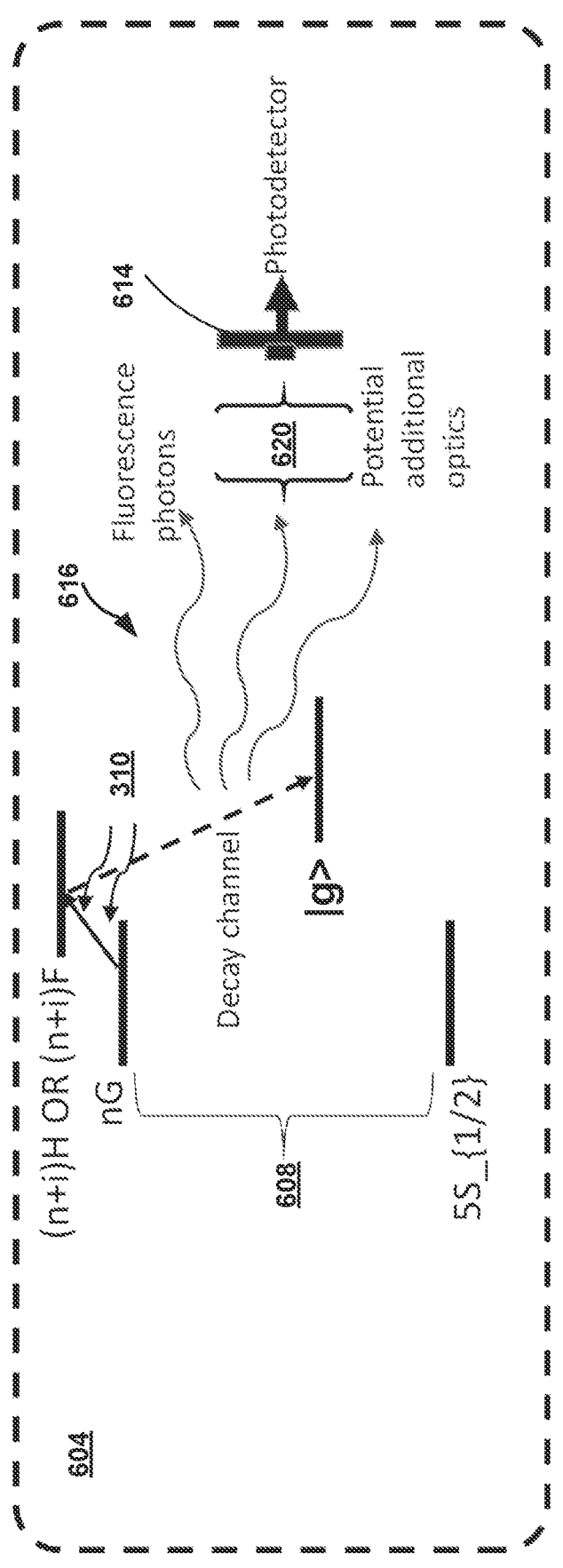
FIG. 6 is a schematic illustration of an example fluorescence detection scheme, in accordance with the techniques of the disclosure.

FIG. 6 is a schematic illustration of an example fluorescence detection scheme 604, in accordance with the techniques of the disclosure. Fluorescence detection scheme 604 may be used, for example, as a detection scheme 104 of sensing systems 100 or as an alternative or additional detection scheme to detection schemes 304, 504.

In the example shown in FIG. 6, fluorescence detection scheme 604 includes preparation scheme 608 and detector 614. Preparation scheme 608 may be substantially similar to any of preparation schemes 108, 208, 508 and/or the three-photon or more than three-photon preparation schemes described with reference to FIGS. 3, 4A-4B, and 5. In the example shown, preparation scheme 608 is a four-photon preparation scheme configured to prepare alkali atoms to one or more |nG> Rydberg energy states. In the example shown, incident EM radiation 310 may further excite the alkali atoms to one or more |(n+i)H> or |(n+i)F> Rydberg energy states.

In some examples, at least a portion of alkali atoms in one of the |(n+i)H> or |(n+i)F> Rydberg energy states may "decay," e.g., transition from a higher energy state to a lower energy state. In the example shown, a portion of alkali atoms in one of the |(n+i)H> or |(n+i)F> Rydberg energy states may decay to an intermediate |g> energy state via emitting a photon 616 having an energy (e.g., frequency) substantially equal to the energy gap between the |(n+i)H> or |(n+i)F> Rydberg energy state and the intermediate state |g>. In some examples, intermediate state |g> may be different than any energy state of preparation scheme 608.

Detector 614 may be configured to sense, detect, measure, capture one or more fluoresced photons 616. In some examples, detector 614 may be substantially similar to detector 314 of FIG. 3. In some examples, detection scheme 604 may further include additional optical elements 620 such as lenses, mirrors, diffraction gratings, optical fibers, and any suitable optical elements configured to collect and/or direct fluoresced photons to detector 614.

In some examples, alkali atoms in an |nG> Rydberg energy state may decay to a different intermediate energy state via fluorescing photons having a different energy than alkali atoms decaying from an |(n+i)H> or |(n+i)F> Rydberg energy state. In other words, alkali atoms excited to an |(n+i)H> or |(n+i)F> Rydberg energy state via incident EM radiation 310 may fluorescent a different amount and/or frequency of photons 616 than alkali atoms in a |nG> Rydberg energy state (e.g., without incident EM radiation 310). In some examples, sensing system 100 and/or 300 may be configured to determine the presence of, amount, and/or spectral content of incident EM radiation 310 based on sensed fluorescence 616.

Figure 7:
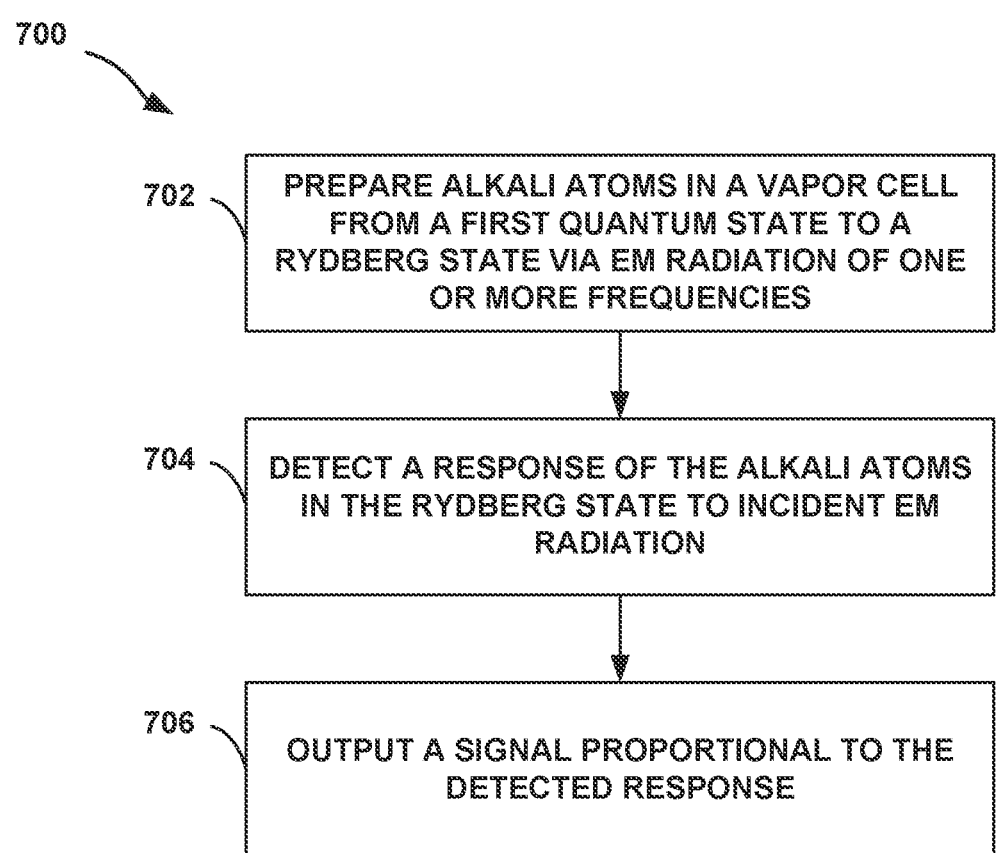
FIG. 7 is a flowchart of an example method of sensing incident EM radiation, in accordance with the techniques of the disclosure.

FIG. 7 is a flowchart of an example method 700 of sensing incident EM radiation, in accordance with the techniques of the disclosure. The method 700 is described with reference to sensor 112 of sensing system 100 of FIG. 3 and as further described with reference to any of FIGS. 1-6.

A sensor 112 may prepare alkali atoms in a vapor cell 102, via EM radiation of one or more frequencies, from a first quantum state to a Rydberg state (702). In some examples, sensor 112 may prepare alkali atoms in the vapor cell 102 to be in a Rydberg state with an orbital angular momentum quantum number e that is at least the number of quanta of the one or more frequencies. In some examples, sensor 112 may prepare alkali atoms in the vapor cell 102 to be in a Rydberg state with an orbital angular momentum quantum number that is at least 3 (l>3). In some examples, sensor 112 may prepare alkali atoms in the vapor cell 102 to be in a Rydberg state with a principal quantum number of the alkali atoms in the second quantum state that is less than or equal to 200 (n≤200).

For example, sensor 112 may prepare the alkali atoms via a four-photon preparation scheme 108 and/or 208 as illustrated and described above with reference to FIG. 2. In some examples, sensor 112 may be a part of a sensing system 100, and computing device 106 may cause preparation scheme 108 to prepare one or more alkali atoms in vapor cell 102 to be in a Rydberg energy state with n≤200 and l≥3.

In some examples, sensor 112 may prepare the alkali atoms in vapor cell 102 to the Rydberg state by preparing the alkali atoms from the first quantum state to a second quantum state of a lower energy than the Rydberg state via EM radiation comprising a first frequency configured to be resonant or near-resonant between the first quantum state and the second quantum state, preparing the alkali atoms from the second quantum state to a third quantum state of a lower energy than the Rydberg state via EM radiation comprising a second frequency configured to be resonant or near-resonant between the second quantum state and the third quantum state, preparing the alkali atoms from the third quantum state to a fourth quantum state of a lower energy than the Rydberg state via EM radiation comprising a third frequency configured to be resonant or near-resonant between the third quantum state and the fourth quantum state, and preparing the alkali atoms from the fourth quantum state to the Rydberg quantum state via EM radiation comprising a fourth frequency configured to be resonant or near-resonant between the fourth quantum state and the Rydberg quantum state.

In some examples, the first frequency may be a visible or a near-infrared (NIR) frequency, the second frequency may be a visible frequency, the third frequency may be at least 1 gigahertz (GHz) and less than 1 terahertz (THz), the fourth frequency may be at least 10 megahertz (MHz) and less than 100 GHz, and each of the first and second frequencies may be different from each other. In some examples, the first frequency may be a visible or a first NIR frequency, the second frequency may be a second NIR frequency, the third frequency may be a third NIR frequency, the fourth frequency may be at least 10 MHz and less than 100 GHz, and each of the first, second, and third frequencies may be different from each other. In some examples, the first frequency may be a visible or NIR frequency, the second frequency may be a second NIR frequency, the third frequency may be a third NIR frequency, the fourth frequency may be a fourth NIR frequency, and each of the first, second, third, and fourth frequencies may be different from each other.

In some examples, sensor 112 may tune at least one resonant frequency between at least one of the first, second, third, fourth, and Rydberg states via an electric field applied to at least a portion of the volume of the vapor cell, e.g., Stark tuning as further described below with reference to FIG. 8.

In some examples, EM radiation comprising at least three of the first, second, third, or fourth frequencies may be arranged in a Doppler-free configuration such that three or more k-vectors of EM radiation comprising at least three of the first, second, third, or fourth frequencies are balanced at relative angles and a total Doppler shift k·v equals zero along at least two orthogonal directions, e.g., such as illustrated and describe below with reference to FIGS. 10A-10F. In some examples, the first, second, third, or fourth EM radiation frequencies are in-plane, and are arranged such the total Doppler shift is zero along a direction normal to the plane of the first, second, third, or fourth EM radiation frequencies.

The sensor 112 may detect a response of the alkali atoms in the Rydberg state to incident EM radiation (704). For example, sensor 112 may include a detection scheme 104 configured to detect a response of the alkali atoms in the Rydberg state to incident EM radiation 110. In some examples, detection scheme 104 may include at least one of the following: detecting a change in electromagnetic induced transparency (EIT) of the alkali atoms for the EM radiation of the first frequency, e.g., such as illustrated and described above with reference to FIGS. 3 and 4A-4D, detecting a signal correlated to a change in the current of an electrical circuit in response to the change in the ionization of the vapor of alkali atoms, e.g., such as illustrated and described above with reference to FIG. 5, or detecting a fluorescence of the alkali atoms, e.g., such as illustrated and described above with reference to FIG. 6.

The sensor 112 may output a signal proportional to the detected response (706). For example, sensor 112 may output one or more values corresponding to the presence, amount (e.g., strength or amplitude), and/or spectral content of EM radiation 110.

Figure 8:
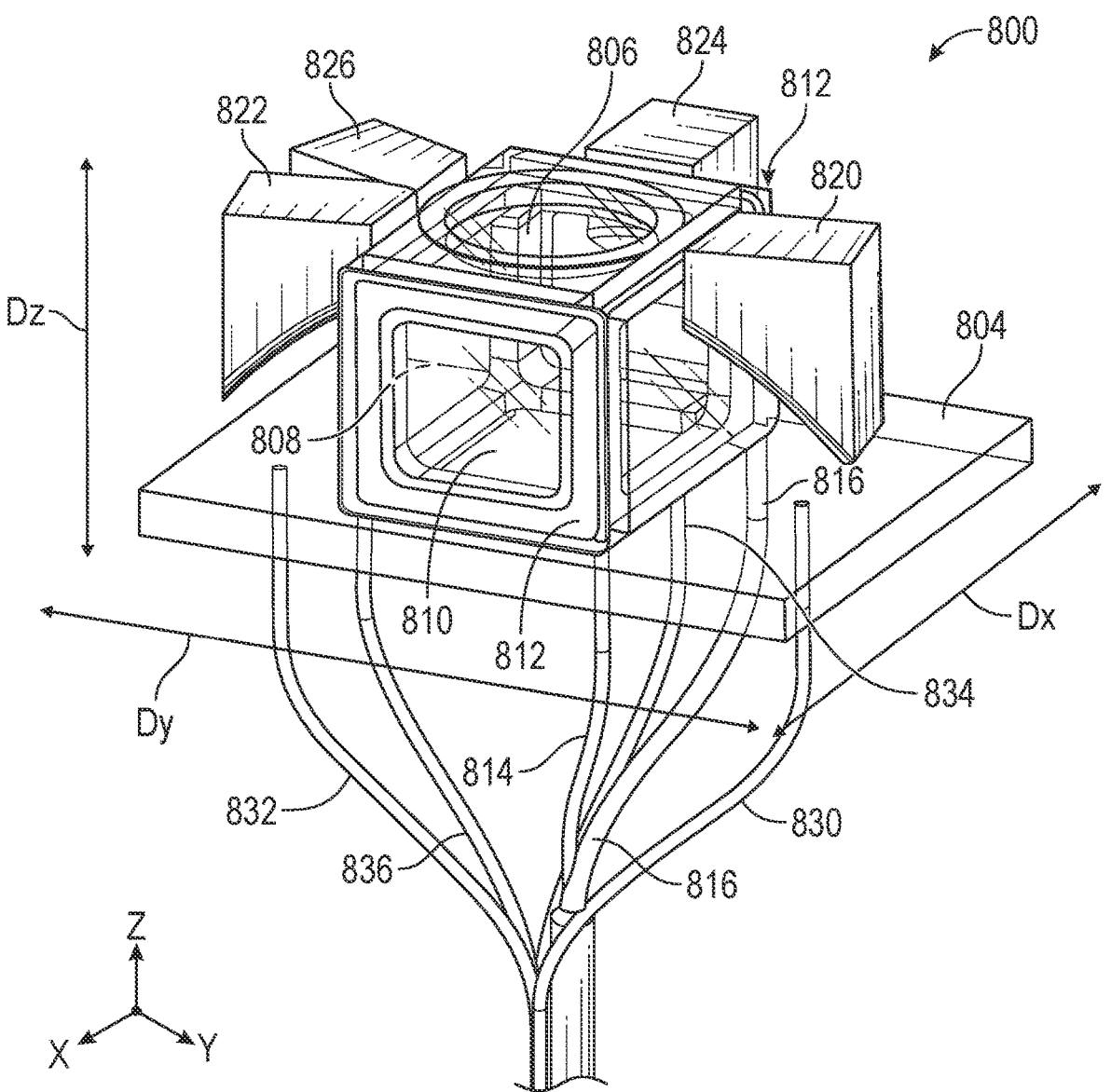
FIG. 8 is an illustration of a perspective view of an example EM sensor, in accordance with the techniques of the disclosure.

FIG. 8 is an illustration of a perspective view of an example EM sensor 800, in accordance with the techniques of the disclosure. EM sensor 800 may be an example of sensor 112 of FIG. 1. In the example shown, EM sensor 800 includes vapor cell 802, optical elements 820-826, optical fibers 830-836, support plate 804, and electrical leads 814, 816 electrically connected to electrodes of electrode surfaces 812 of vapor cell 802.

In the example shown, EM sensor 800 is configured to prepare alkali atoms within vapor cell 802 via any of the preparation schemes 108, 208, 508, 608 described above with reference to FIGS. 1-6, e.g., any of all-optical and/or mixed optical-RF preparation schemes. EM sensor 800 is also configured to detect, sense, measure, capture a response of the alkali atoms to incident EM radiation via any of the detection schemes 104, 304, 504, 604 illustrated and described above with reference to FIGS. 1-6.

Vapor cell 802 may be substantially similar to vapor cells 102, 302 described above, e.g., configured to contain a vapor of alkali atoms and transmit EM radiation. In the example shown, vapor cell 802 is supported by support plate 804, which may also support optical fibers 830-836 in position to direct EM radiation to alkali atoms within vapor cell 802 via optical elements 820-826. Vapor cell 802 is a six-sided cube with dimensions Dx, Dy, Dz as shown. In some examples, Dx may be about 10.5 mm, Dy may be about 13.6 mm, and Dz may be about 7 mm. In some examples, vapor cell 802 may have a volume of less than 1.0 cubic centimeter (cc). In some examples, vapor cell 802 may have any number of sides, e.g., more or fewer than six sides and may be a cuboid, a tetrahedron, a triangular prism, a pyramid or square pyramid, or any suitable 3D shape.

In the example shown, surface 806 of vapor cell 802 may be configured to receive and/or transmit incident EM radiation. In some examples, surface 806 may be a dielectric window. In some examples, surface 806 may have a thickness of less than 100 μm, and may be configured to transmit at least 99% of incident EM radiation, e.g., incident EM radiation 110 comprising frequencies from about 10 MHz to about 40 GHz. In some examples, surface 806 may be a glass membrane that is less than 100 μm thick and bonded into a wall of vapor cell 802, e.g., so as to be robust and maintain structural integrity between an external atmospheric pressure and a lower internal pressure, e.g., an internal ultra-high vacuum. In some examples, surface 806 may be a flat or a curved window, e.g., a window that is curved by anodically bonding the window over a hole in a frame chosen to have a large thermal expansion mismatch. After cooling, the window may curve from the strain induced by the thermal expansion difference. Surface 806 may have a sagitta of less than or equal to 50 microns (μm) across a diameter of about 4 mm, e.g., so as to be well below a typical tensile strength for glasses, e.g., ≤30 mega Pascals (MPa). In some examples, surface 806 may be fused silica.

In the example shown, surface 806 and surface 810 are parallel with the x-y plane. The four surfaces shown that are perpendicular to the x-y plane, including electrode surfaces 812, may be suitably transparent to one or more preparation EM radiation frequencies, e.g., visible, NIR, IR, and or RF EM radiation of any suitable preparation frequency, and may also be robust to withstand atmospheric pressures resulting from an ultra-high vacuum within vapor cell 802. Electrode surfaces 812 may further include one or more electrodes, which may be substantially similar to electrodes 518 of FIG. 5. The electrodes of electrode surfaces 812 may be configured to apply a DC electric field such as DC electric field 516 of FIG. 5, and may be configured to collect free-charges of an ionized alkali vapor as described above. In some examples, the electrodes of surfaces 812 may be disposed on the inside of electrode surfaces 812 and may be in contact with the alkali atoms of vapor cell 802. In some examples, the electrodes of electrode surfaces 812 may be a metal and/or a transparent conductor, such as titanium (e.g., transparent to EM radiation in at least one of a visible, NIR, IR, or RF frequency range).

Optical elements 820-826 may be configured to direct EM radiation to the alkali atoms of vapor cell 802. In some examples, optical elements 820-826 may be micro-optical elements configured to provide substantially collimated beams of about 2 mm diameter at one or more predetermined angles within the x-y plane and to be co-incident and/or intersect on a volume and at least a portion of the alkali atoms within vapor cell 802. For example, optical elements 820-826 may be parabolic turning mirrors configured to collimate and direct EM radiations $f_1$, $f_2$, $f_3$, $f_4$ of an all-optical preparation scheme 108 to intersect within vapor cell 802 at specified angles configured to prepare at least a portion of the alkali atoms to a Doppler-free Rydberg state.

In some examples, the intersection volume may be substantially centrally located within vapor cell 802. In some examples, optical elements 820-826 may be any and/or all of off-axis parabolic reflectors, compound refractive lenses as well as single-element refractive lenses (e.g., "aspheres"), turning mirrors and prisms, flat mirrors, diffractive optics, spatial and/or spectral filters, alone or in combination configured to direct and substantially collimate EM radiation to the intersection volume/position within vapor cell 802.

Optical fibers 830-836 may be configured to transmit and transport EM radiation from an EM radiation source to a desired fiber exit position. In some examples, optical fibers 830-836 may be configured to collect EM radiation from one or more EM radiation sources and output the collected EM radiation to optical elements 820-826. In other words, optical fibers 830-836 may be configured to work in conjunction with optical elements 820-826 to direct EM radiation from one or more EM radiation sources to the intersection volume/position within vapor cell 802. In the example shown, the exit ends of optical fibers 830-836 are positioned within support plate 804, e.g., inserted and held within one or more holes within support plate 804 so as to be held in suitable positions with the correct orientation. In some examples, optical fibers 830-836 may be bonded and/or fastened to support plate 804, vapor cell 802 may be bonded and/or fastened to support plate 804, and optical elements 820-826 may be bonded and/or fastened to either support plate 804 and/or vapor cell 802, e.g., so as to fix each of vapor cell 802, optical elements 820-826, and optical fibers 830-836 with suitable positions and orientations with respect to each other to implement preparation scheme 108.

Figure 9:
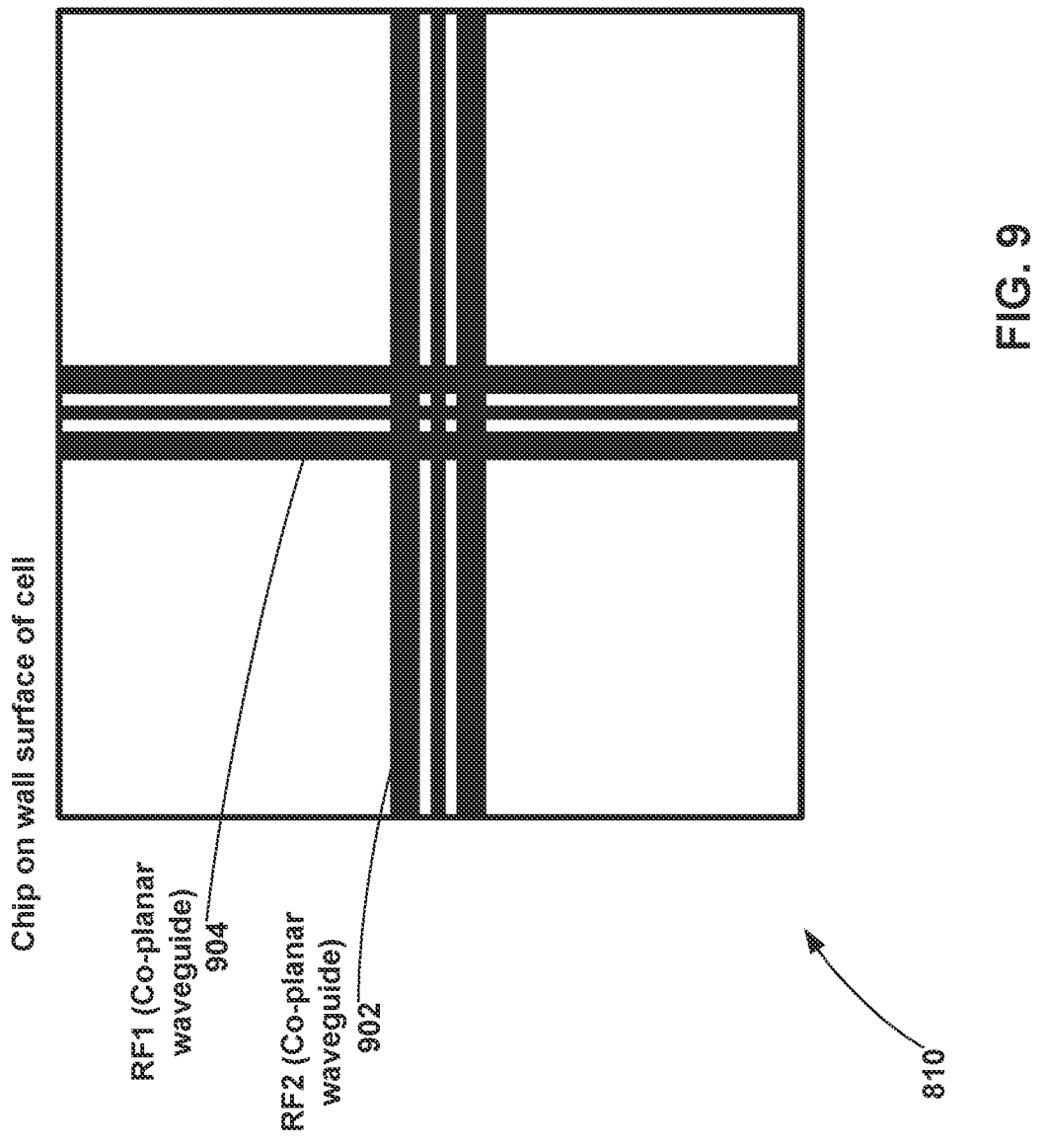
FIG. 9 is schematic illustration of co-planar RF waveguides, in accordance with the techniques of the disclosure.
Figure 10:
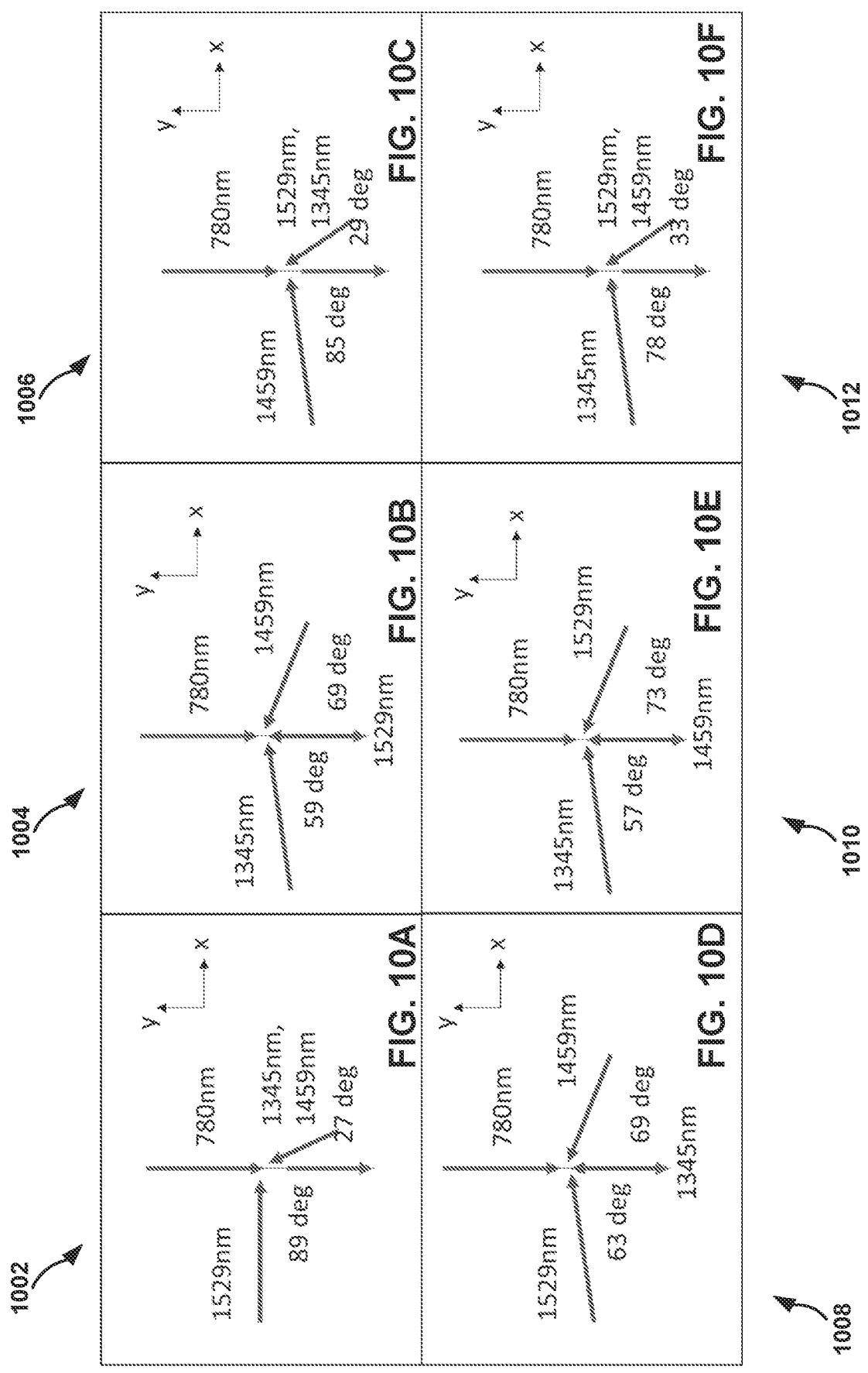
FIGS. 10A-10F are plots of example beam configurations for Doppler-free preparation of alkali atoms, in accordance with the techniques of the disclosure.

In some examples, surface 810 of vapor cell 802 (e.g., parallel with the x-y plane and opposite surface 806) may include one or more waveguides, such as RF waveguides. In some examples, surface 810 may include two or more co-planar RF waveguides 902, 904, such as illustrated in FIG. 9. For example, preparation scheme 108 may be a mixed optical-RF preparation scheme that utilizes only some of optical fibers 830-836 and optical elements 820-826 and RF waveguides 902, 904 to provide the preparation EM radiation frequencies to at least a portion of the alkali atoms within vapor cell 802. For example, co-planar RF waveguides 902, 904 may be connected to one or more wires and/or other waveguides (not shown) and configured to guide RF EM radiation from an RF EM radiation source and extract and/or direct RF EM radiation to at least a portion of the alkali atoms within vapor cell 802, e.g., and at the intersection volume/position within vapor cell 802 corresponding to one or more optical preparation EM radiation beams as described above. In some examples, each of co-planar RF waveguides 902, 904 may be parallel or at an angle with respect to each other, e.g., within the x-y plane. In the example shown, co-planar RF waveguides 902, 904 are perpendicular to each other and intersect at a substantially central location on surface 810, and are configured to extract and direct RF EM radiation to the substantially centrally located intersection volume/position in conjunction with optical EM radiation from optical elements 820-826. In some examples, RF waveguides 902, 904 may comprise RF planar waveguide traces that may be coated on surface 810. In some examples, surface 810 may be glass. In some examples, the substantially centrally located intersection volume/position may be less than 10 mm from either of co-planar RF waveguides 902, 904.

In some examples, sensor 800 may be configured to implement Stark tuning. For example, the electrodes of electrode surfaces 812 may be configured to apply a DC electric field within the volume of vapor cell 802. Stark tuning is a technique of tuning an atomic resonance via an applied DC electric field. Stark tuning may be a fine-tuning technique that may be combined with tuning and/or detuning of one or more of preparation EM radiation $f_1$, $f_2$, $f_3$, $f_4$ beams, e.g., such that a continuum of resonances of incident EM radiation 110, 310 spanning a range from less than 10 MHz to about 1 THz between the prepared Rydberg state and another allowed quantum energy state may be sensed, detected, captured, and/or measured, e.g., via sensor 800. In other words, Stark tuning may increase the dynamic range of sensor 800 to detect a larger range of incident EM radiation, such as any of incident EM radiation 110, 310. In some examples, internal electrodes, such as electrodes of electrode surfaces 812, may be titanium that is thin-film-coated onto the inside of electrode surfaces 812 (which may be glass surfaces), e.g., for RF signal transparency, and designed such that a DC field is as uniform as possible substantially in the center of vapor cell 802 while allowing for optical throughput of one or more preparation EM radiation $f_1$, $f_2$, $f_3$, $f_4$ beams. In some examples, sensor 800 may be configured to cause the electrodes of electrode surfaces 812 to apply an alternating electric field (e.g., from an applied AC), e.g., to apply dynamic and/or AC Stark tuning. In some examples, the applied DC and/or AC electric field for Stark tuning may be greater than 1 mV/cm, greater than 3.5 mV/cm, greater than 5 mV/cm, greater than 10 mV/cm, or any suitable strength DC and/or AC electric field.

FIGS. 10A-10F are plots of example beam configurations 1002-1012 for Doppler-free preparation of alkali atoms, in accordance with the techniques of the disclosure. In the example shown, each of configurations 1002-1012 corresponds to an all-optical preparation scheme 108, 308 and illustrates beam angles of substantially collimated EM radiation $f_1$, $f_2$, $f_3$, $f_4$ beams in the x-y plane, e.g., relative to each other and/or an x-y coordinate axis. In some examples (not shown), Doppler-free preparation of alkali atoms may use other preparations schemes, e.g., a mixed optical-RF excitation scheme, and the beam angles of the substantially collimated EM radiation $f_1$, $f_2$, $f_3$, $f_4$ beams need not be confined to a 2D plane, e.g., EM radiation $f_1$, $f_2$, $f_3$, $f_4$ beams may have any suitable angle in any relative to any of the x, y, or z axes. In some examples, configurations 1002-1012 may each be realized via sensor 800, 1100, 1500, 1600, and/or EM sensor array 1800, e.g., via optical elements 820-826, elements 1120-1126, and/or metasurfaces 1150-1156, 1550. Substantially collimated EM radiation $f_1$, $f_2$, $f_3$, $f_4$ beams are described below with reference to their wave vectors denoting a direction in 3D space perpendicular their wavefronts, e.g., k-vector or k, relative to the velocity of an alkali atom or the average velocity of an ensemble of alkali atoms, e.g., the 3D vector V.

In the example shown, each of configurations 1002-1012 may be a "star" configuration. Each of configurations 1002-1012 may be configured to increase the sensitivity of an EM radiation sensor, e.g., sensor 802, by preparing alkali atoms within vapor cell 802 having a wide range of velocity classes and while allowing for preparation EM radiation field uniformity across the interaction region, e.g., the substantially centrally located intersection volume/position within vapor cell 802. Each of configurations 1002-1012 may be an example of rubidium atoms within vapor cell 802 and a four-photon all-optical preparation scheme, such as described with reference to FIG. 2. In each of configurations 1002-1012, the k-vectors of the optical interrogation beams are balanced at relative angles, so the total k-vector (e.g., wave vector $27\pi/\lambda$ of plane waves in a specified direction)

equals zero along both orthogonal directions x and y. For example, the first-order Doppler shift k·v is zero along x and y because the corresponding k-component is zero. The shift is zero along z direction (not shown) because the velocity projection is orthogonal to the z-axis, e.g., substantially all within the x-y plane.

In some examples, a Doppler-free configuration such as each of configurations 1002-1012 may provide a wide range of atom velocity classes with zero Doppler-related detuning which may increase the number of atoms on-resonance with one or more of the preparation EM radiation beams $f_1$, $f_2$, $f_3$, $f_4$. In other words, each of configurations 1002-1012 may compensate for alkali atoms oscillating and/or moving with vapor cell 802 with a wide range of speeds and directions such that those alkali atoms are not Doppler-shifted to being detuned and off-resonance with one or more of the preparation EM radiation beams $f_1$, $f_2$, $f_3$, $f_4$. As such, a greater population of the alkali atoms may be on-resonance with the preparation EM radiation beams and may be prepared in, and populate, the intended Rydberg state, thereby increasing the Rydberg density (e.g., of alkali atoms in the Rydberg state) and the signal sensitivity of sensor 800. In some examples, any of configurations 1002-1012 may increase the sensitivity of an EM sensor such as sensor 800 by one or more orders of magnitude, may provide a well-defined interrogation region substantially centrally located within vapor cell 802, reduce effects due to RF field nonuniformity throughout the vapor cell 802, and reduce atom-wall interactions between the alkali atoms and one or more vapor cell 802 wall and/or inner surface.

In other examples, other configurations analogous to configurations 1002-1012 may be utilized by a sensor such as sensors 800, 1100, 1500, or 1600, for example, three-photon or more than four-photon preparation schemes.

Figure 11:
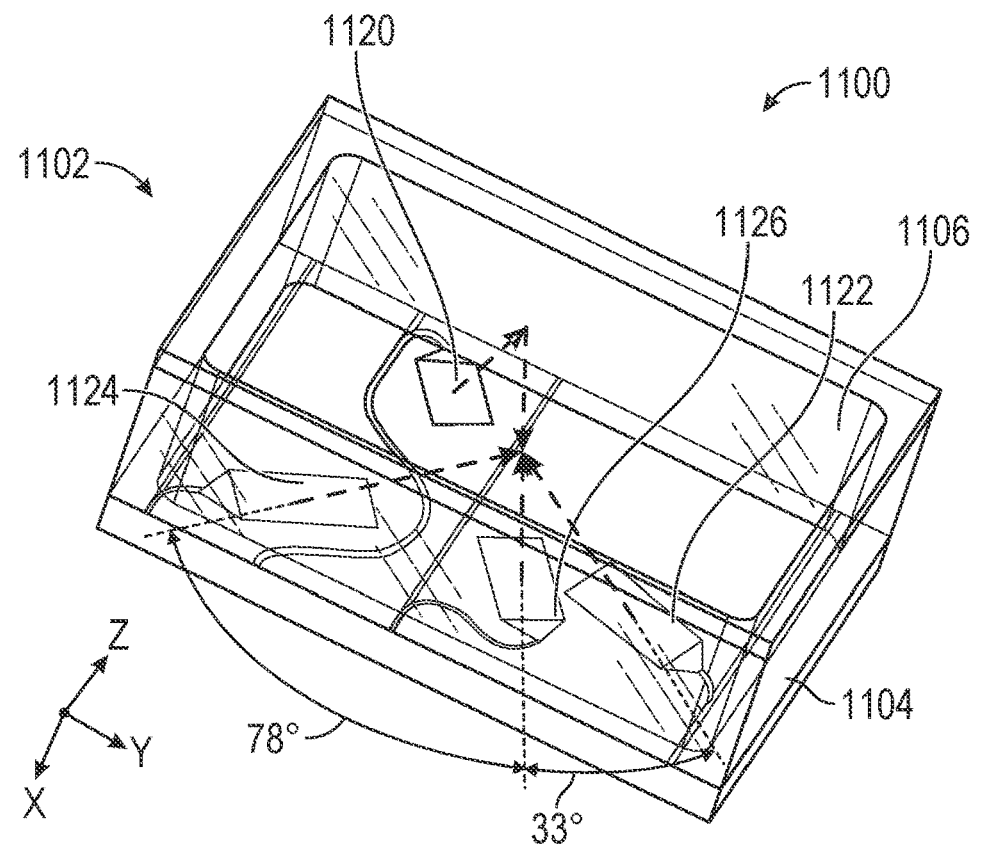
FIG. 11 is an illustration of a perspective view of another example EM sensor, in accordance with the techniques of the disclosure.
Figure 12:
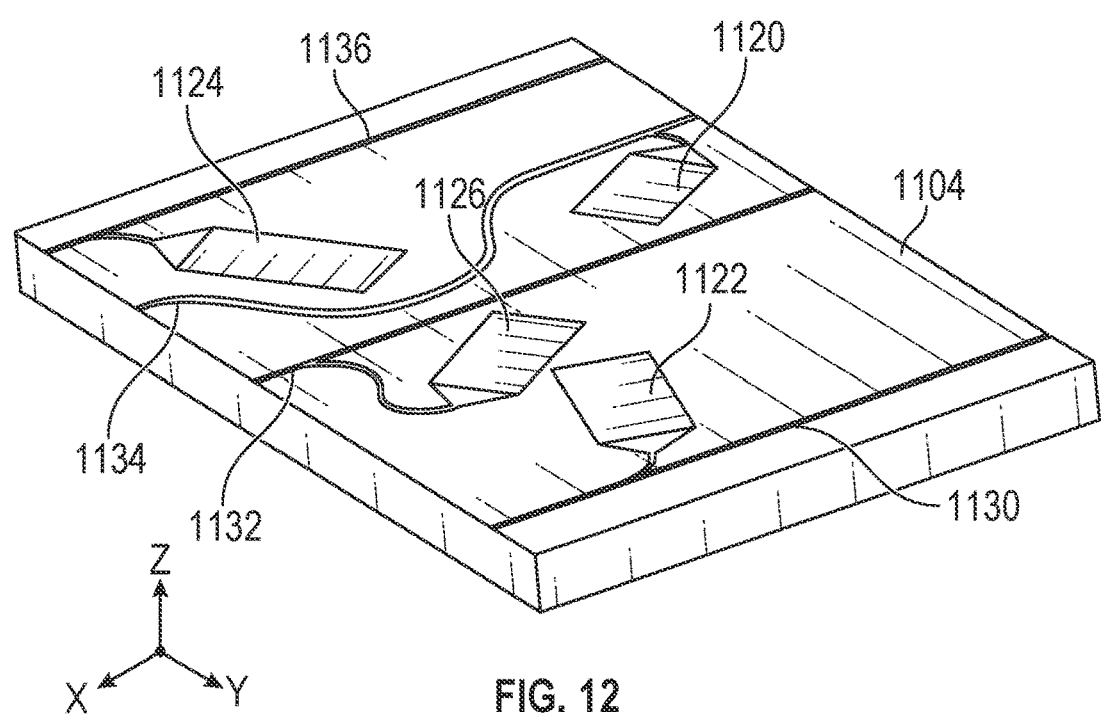
FIG. 12 is an illustration of a perspective view of an example substrate of the EM sensor of FIG. 11, in accordance with the techniques of the disclosure.

FIG. 11 is an illustration of a perspective view of another example EM sensor 1100, in accordance with the techniques of the disclosure. FIG. 12 is an illustration of a perspective view of the example substrate of the EM sensor 1100 of FIG. 11, in accordance with the techniques of the disclosure. EM sensor 1100 may be an example of sensor 112 of FIG. 1. In the example shown, EM sensor 1100 includes vapor cell 1102, elements 1120-1126, and substrate 1104.

In the example shown, EM sensor 1100 is configured to prepare alkali atoms within vapor cell 1102 via any of the preparation schemes 108, 208, 508, 608 described above with reference to FIGS. 1-6, e.g., any of all-optical and/or mixed optical-RF preparation schemes. EM sensor 1100 is also configured to detect, sense, measure, capture a response of the alkali atoms to incident EM radiation via any of the detection schemes 104, 304, 504, 604 illustrated and described above with reference to FIGS. 1-6.

Vapor cell 1102 may be substantially similar to vapor cells 102, 302 described above, e.g., configured to contain a vapor of alkali atoms and transmit EM radiation. In some examples, EM sensor 1100 may be substantially similar to EM sensor 800, and vapor cell 1102 may be substantially similar to vapor cell 802, except that EM sensor 1100 and vapor cell 1102 include substrate 1104, which may be nontransparent to EM radiation in at least one of a visible, NIR, IR, or RF frequency range. In some examples, substrate 1104 may be a photonic integrated circuit, e.g., including one or more integrated photonic components such as elements 1120-1126 and waveguides 1130-1136. For example substrate 1104 may comprise silicon, and waveguides 1130-1136 may be etched channels in substrate 1104, or waveguides 1130-1136 may be embedded within substrate 1104. Waveguides 1130-1136 are configured to guide at least one of optical, visible, NIR, IR, or RF frequency EM radiation to optical elements 1120-1126, e.g., to guide EM radiation for preparation of alkali atoms according to any of the preparation configurations described herein, e.g., EM radiation $f_1$, $f_2$, $f_3$, $f_4$. Elements 1120-1126 may be extractors configured to expand the area of EM radiation $f_1$, $f_2$, $f_3$, $f_4$ from waveguides 1130-1136 (e.g., in the x-y plane in the examples shown) and extract EM radiation $f_1$, $f_2$, $f_3$, $f_4$ from waveguides 1130-1136 (e.g., out of the x-y plane as shown in the examples of FIGS. 11, 13-17) in a particular direction. In some examples, elements 1120-1126 are configured to shape beams of EM radiation $f_1$, $f_2$, $f_3$, $f_4$ extracted from waveguides 1130-1136, e.g., to collimate, focus (diverging or converging) or otherwise shape wavefronts of EM radiation $f_1$, $f_2$, $f_3$, $f_4$. In some examples, elements 1120-1126 may be diffraction gratings, Bragg gratings, microlenses and/or microlens arrays, surface waveguide features (e.g., protrusions and/or recesses), embedded features (e.g., scattering particles), or any suitable feature configured to extract and/or shape EM radiation $f_1$, $f_2$, $f_3$, $f_4$ from waveguides 1130-1136. In some examples, waveguides 1130-1136 and elements 1120-1126 are configured to guide and shape EM radiation $f_1$, $f_2$, $f_3$, $f_4$ for any beam configuration for preparation of alkali atoms described herein, e.g., configurations 1002-1012 used in conjunction with all-optical and/or mixed optical-RF excitation schemes. In the examples shown, waveguides 1130-1136 and elements 1120-1126 are configured to guide and shape EM radiation $f_1$, $f_2$, $f_3$, $f_4$ for any beam configuration for preparation of alkali atoms in a plane that is rotate with respect the surfaces and/or walls of vapor cell 1102, e.g., with respect to a surface of substrate 1104, surface 1106, and/or sidewalls of vapor cell 1102. In other words, waveguides 1130-1136 and elements 1120-1126 may be configured to extract EM radiation $f_1$, $f_2$, $f_3$, $f_4$ in any of beam configurations 1002-1012 in a plane that is rotate/tilted from the x-y plane defined by surfaces of vapor cell 1102. In the example shown, at least a part of EM radiation directed by element 1120 reflects from surface 1106 towards substrate 1104.

In the example shown, vapor cell 1102 is supported by substrate 1104, which may also include optical elements 1120-1126 and waveguides 1130-1136, e.g., to direct EM radiation to alkali atoms within vapor cell 1102. In some examples, substrate 1104 may be a photonic integrated circuit. Vapor cell 1102 is a six-sided cube and may have a volume of less than 1.0 cubic centimeter (cc). In some examples, vapor cell 1102 may have any number of sides, e.g., more or fewer than six sides and may be a cuboid, a tetrahedron, a triangular prism, a pyramid or square pyramid, or any suitable 3D shape.

In the example shown, surface 1106 of vapor cell 1102 may be configured to receive and/or transmit incident EM radiation. In some examples, surface 1106 may be a dielectric window. In some examples, surface 1106 may have a thickness of less than 100 μm, and may be configured to transmit at least 99% of incident EM radiation, e.g., incident EM radiation 110 comprising frequencies from about 10 MHz to about 40 GHz. In some examples, surface 1106 may be a glass membrane that is less than 100 μm thick and bonded into a wall of vapor cell 1102, e.g., so as to be robust and maintain structural integrity between an external atmospheric pressure and a lower internal pressure, e.g., an internal ultra-high vacuum. In some examples, surface 1106 may be a flat or a curved window, e.g., a window that is curved by anodically bonding the window over a hole in a frame chosen to have a large thermal expansion mismatch. After cooling, the window may curve from the strain induced by the thermal expansion difference. Surface 1106 may have a sagitta of less than or equal to 50 microns (μm) across a diameter of about 4 mm, e.g., so as to be well below a typical tensile strength for glasses, e.g., ≤30 mega Pascals (MPa). In some examples, surface 1106 may be fused silica. In the example shown, surface 1106 (and the other surfaces of vapor cell 1102) may be robust to withstand atmospheric pressures resulting from an ultra-high vacuum within vapor cell 1102.

Optical elements 1120-1126 may be configured to direct EM radiation to the alkali atoms of vapor cell 1102, as described above. In some examples, optical elements 1120-1126 may be micro-optical elements configured to provide substantially collimated beams of about 2 mm diameter at one or more predetermined angles out of the x-y plane and to be co-incident and/or intersect on a volume and at least a portion of the alkali atoms within vapor cell 1102. For example, optical elements 1120-1126 may be configured to collimate and direct EM radiations $f_1$, $f_2$, $f_3$, $f_4$ of an all-optical preparation scheme 108 to intersect within vapor cell 1102 at specified angles configured to prepare at least a portion of the alkali atoms to a Doppler-free Rydberg state. In some examples, the intersection volume may be substantially centrally located within vapor cell 1102.

Figure 13:
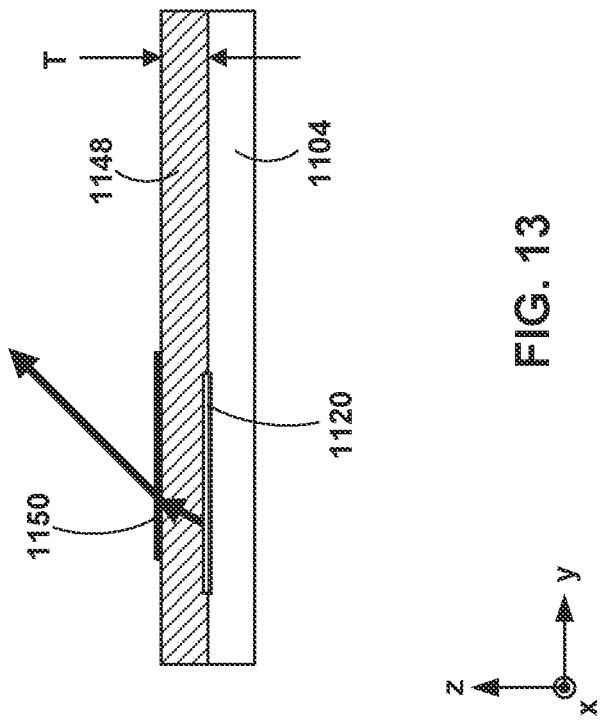
FIG. 13 is an illustration of a cross-sectional view of the example substrate of FIG. 12 and a metasurface, in accordance with the techniques of the disclosure.

FIG. 13 is an illustration of a cross-sectional view of an example substrate 1104 of FIG. 12 and a metasurface 1150, in accordance with the techniques of the disclosure. In the examples shown, a metasurface layer 1148 is disposed on a surface of substrate 1104, e.g., an inner surface of vapor cell 1102 (not shown). A portion of a surface of metasurface layer 1148 comprises metasurface 1150. Metasurface layer 1148 has a thickness T. Thickness T may be configured in conjunction with the design of element 1120 and metasurface 1150, e.g., metasurface layer 1148 may be configured to offset metasurface 1150 in the z-direction from element 1120 by a separation distance T. In some examples, T may be about 500 micrometers (microns). In some examples, T may be at least 10 microns, at least 50 microns, at least 100 microns, at least 500 microns, at least 1 millimeter, or at least 5 millimeters. Metasurface layer 1148 may comprise any material substantially transparent to EM radiation, e.g., EM radiations $f_1$, $f_2$, $f_3$, $f_4$.

In some examples, a portion of an inner and/or outer surface of substrate 1104 may comprise metasurface 1150, and in other examples the inner and/or outer surfaces of metasurface layer 1148 comprises metasurface 1150. In the example shown, substrate 1104 also includes element 1120. FIG. 13 is described with reference to metasurface 1150 and element 1120, however, the description also applies to metasurfaces 1152-1156 and elements 1152-1156, e.g., of FIGS. 15-17.

In some examples, metasurface 1150 comprises micro- and/or nano-features, patterns, and/or structures configured to redirect and/or beam shape EM radiation, e.g., at least one of optical, visible, NIR, IR, or RF frequency EM radiation. In some examples, metasurface 1150 may be configured to direct and/or shape EM radiation in conjunction with element 1120. For example, element 1120 may be configured to extract EM radiation from waveguides 1130, and metasurface 1150 may be configured to further direct (e.g., "fine tune" the beam direction) and beam shape the extracted EM radiation (e.g., collimate, focus or converge, or defocus or diverge, the EM radiation).

Figure 14:
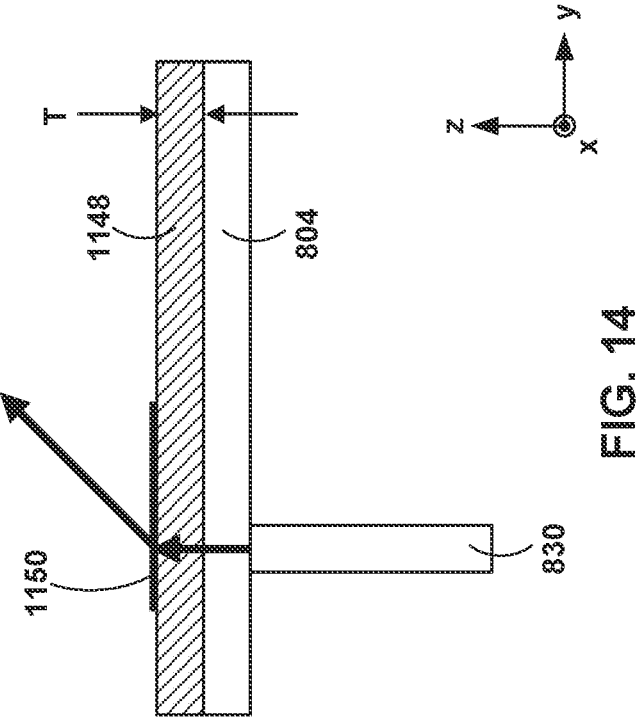
FIG. 14 is an illustration of a cross-sectional view of another example substrate of the EM sensor of FIG. 11 and a metasurface, in accordance with the techniques of the disclosure.

In other examples, metasurface 1150 may be configured to direct and/or beam shape EM radiation or in lieu of element 1120, e.g., as shown in FIG. 14. FIG. 14 is an illustration of a cross-sectional view of support plate 804 of EM sensor 1100 of FIG. 11, e.g., replacing substrate 1104, in accordance with the techniques of the disclosure. For example, EM sensor 1100 may be substantially similar to EM sensor 800 including substrate 804, except that optical elements 820-826 are replaced with metasurfaces 1150-1156 (shown in FIGS. 15-16 below), and the corresponding optical fibers 830-836 may be positioned to direct EM radiation "within" vapor cell 1102, e.g., the ends of fibers 830-836 are shifted to an area of support plate 804 corresponding to an area within the walls of vapor cell 1102. In the example shown, EM radiation is positioned via optical fiber 830, and metasurface 1150 is configured to direct and shape (e.g., collimate) EM radiation exiting optical fiber 830.

In other examples, support plate 804 may include element 1120 (not shown in FIG. 14). For example, fiber 830 may be positioned to direct EM radiation towards the inner volume of vapor cell 1102, element 1120 may be configured to direct and/or beam shape (collimate) the EM radiation, and metasurface 1150 may be configured to direct and/or beam shape (collimate) the EM radiation, e.g., fine tune the direction and/or collimation of the EM radiation.

Figure 15:
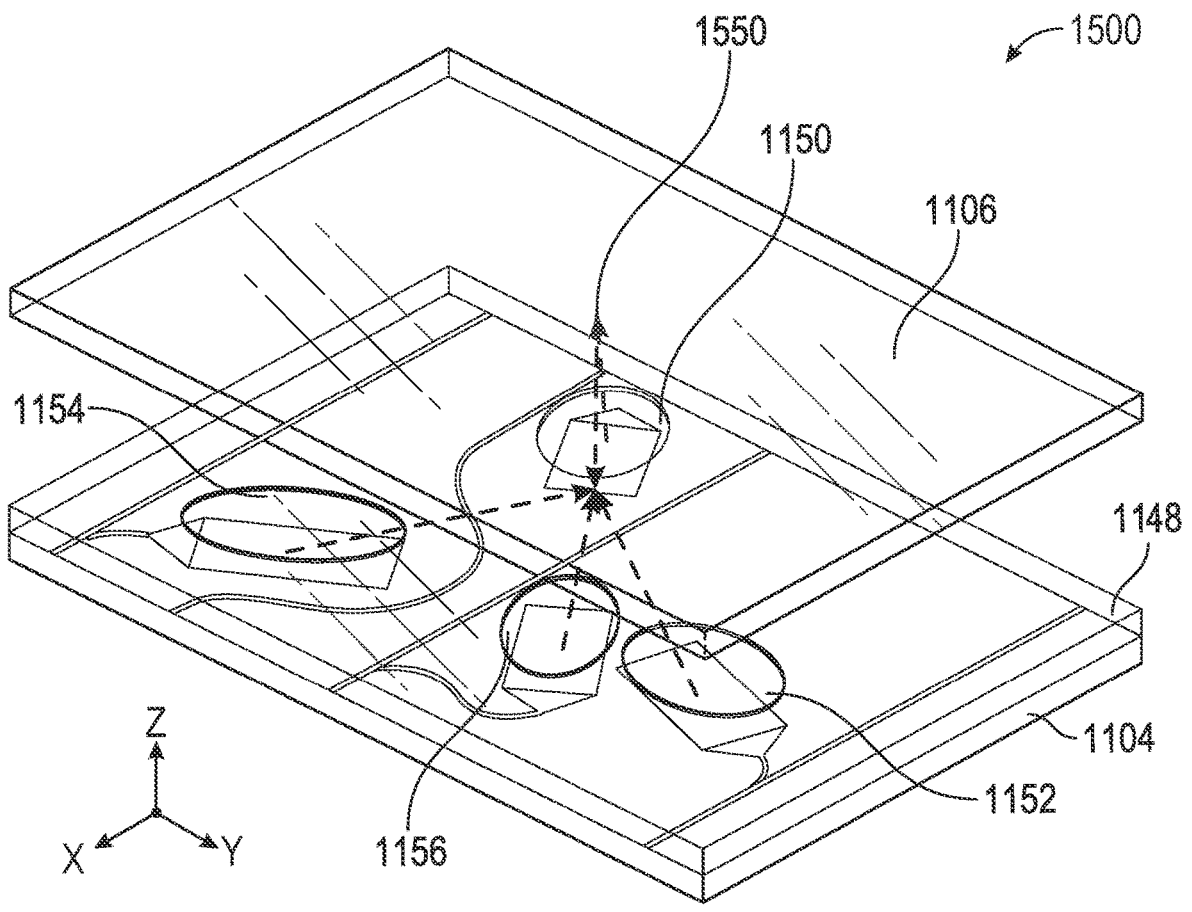
FIG. 15 is an illustration of a perspective view of another example EM sensor, in accordance with the techniques of the disclosure.
Figures 16, 17:
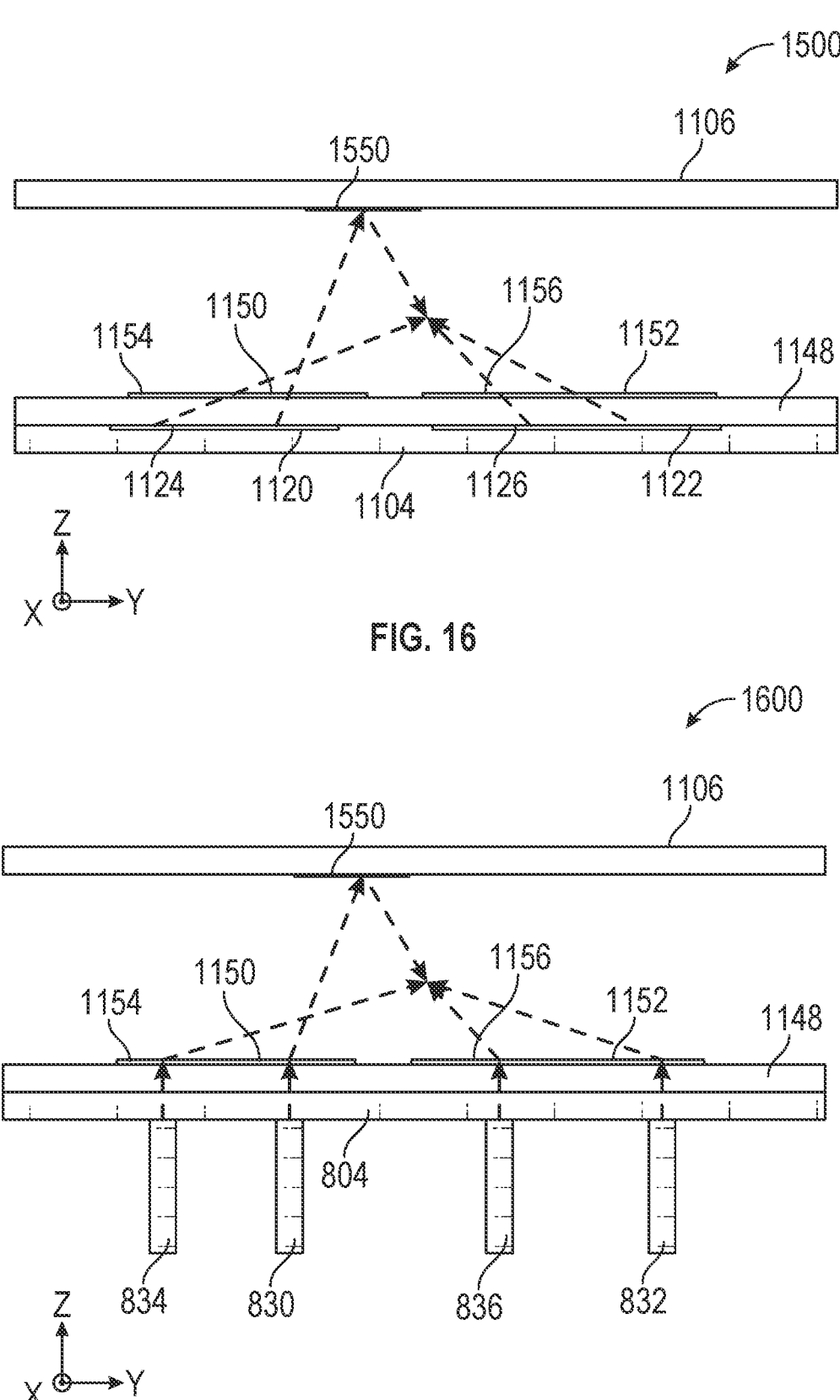
FIG. 16 is an illustration of a side view of the example EM sensor of FIG. 15, in accordance with the techniques of the disclosure.
FIG. 17 is an illustration of a side view of another example EM sensor, in accordance with the techniques of the disclosure.

FIG. 15 is an illustration of a perspective view of another example EM sensor 1500, in accordance with the techniques of the disclosure, and FIG. 16 is an illustration of a side view of the example EM sensor of FIG. 15. FIG. 17 is an illustration of a side view of another example EM sensor 1600, in accordance with the techniques of the disclosure.

EM sensor 1500 may be substantially similar to EM sensor 1100 described above, except that surface 1106 includes metasurface 1550. Metasurface 1550 may be substantially the same as metasurface 1150 described above. In some examples, metasurface 1550 may replace metasurface 1150 in EM sensor 1500, and in other examples metasurface 1550 may function in conjunction with metasurface 1150 (as shown), e.g., to further direct and/or beam shape (collimate) EM radiation extracted from element 1120 and/or directed towards vapor cell 1102 via optical fiber 830 (not shown). EM sensor 1600 may be substantially similar to EM sensor 1500, except with substrate 1104 replaced by support plate 804 and waveguides 1130-1136 replaced by optical fibers 830-836 (and optical fibers 830-836 may be arranged within an area of support plate 804 that is within the walls of the vapor cell of EM sensor 1600 so as to direct light into the vapor cell of EM sensor 1600, similar to as described above with reference to FIG. 14).

Figure 18:
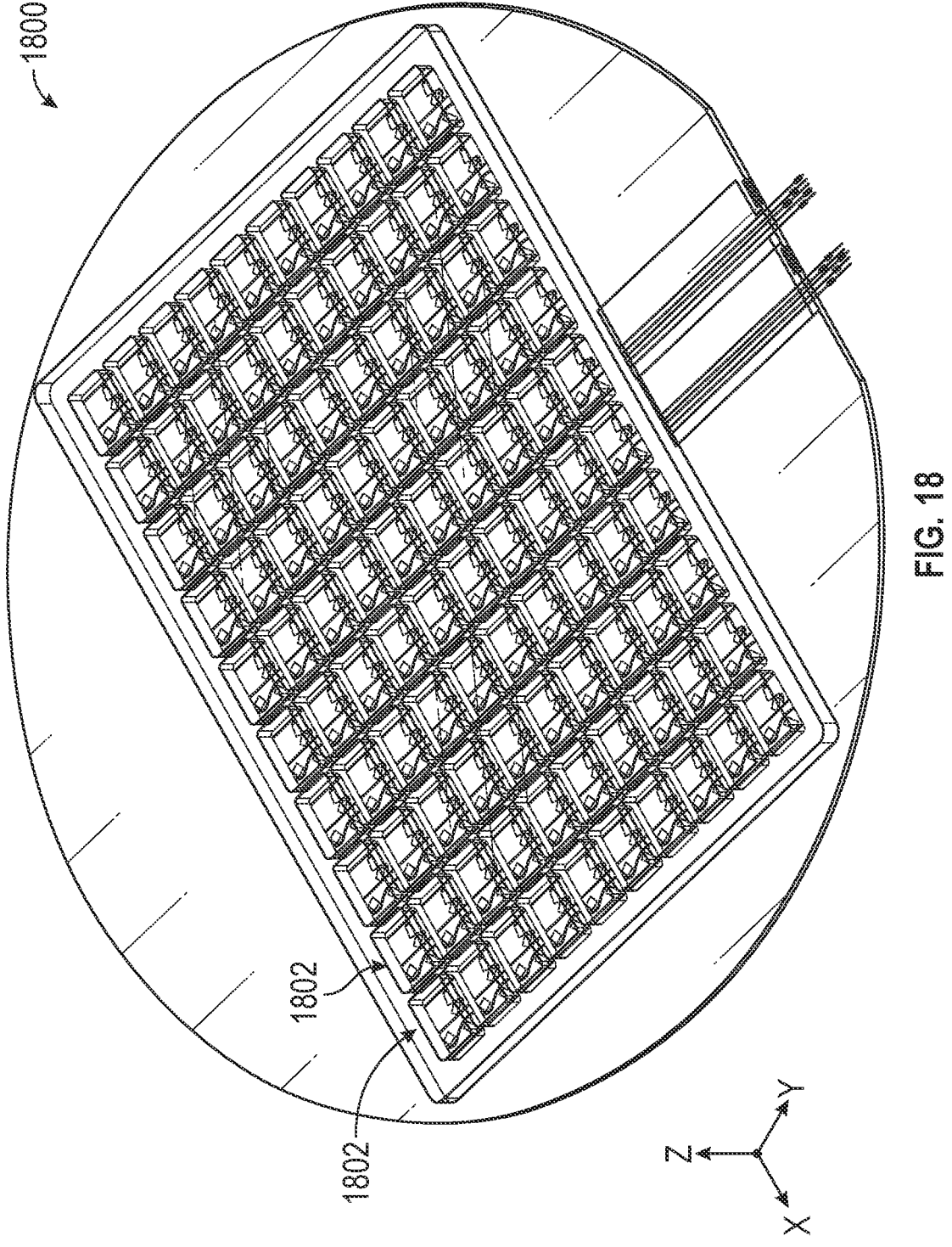
FIG. 18 is an illustration of a perspective view of an example EM sensor array, in accordance with the techniques of the disclosure.

FIG. 18 is an illustration of a perspective view of an example EM sensor array 1800, in accordance with the techniques of the disclosure. EM sensor array 1800 comprises a plurality of sensor elements 1802. Sensor elements 1802 may be any of the EM sensors described herein, e.g., EM sensor 112, 800, 1100, 1500, or 1600. EM sensor array 1800 may function as a standalone array, as a phased array, and/or as a focal plane array, e.g., configured to sense/detect/ capture and EM image focused on EM sensor array 1800 via EM radiation focusing optics (not shown).

The techniques described in this disclosure may be implemented, at least in part, in hardware, software, firmware, or any combination thereof. For example, various aspects of the techniques may be implemented within one or more microprocessors, DSPs, ASICs, FPGAs, or any other equivalent integrated or discrete logic QRS circuitry, as well as any combinations of such components, embodied in external devices. The terms "processor" and "processing circuitry" may generally refer to any of the foregoing logic circuitry, alone or in combination with other logic circuitry, or any other equivalent circuitry, and alone or in combination with other digital or analog circuitry.

For aspects implemented in software, at least some of the functionality ascribed to the systems and devices described in this disclosure may be embodied as instructions on a computer-readable storage medium such as RAM, DRAM, SRAM, magnetic discs, optical discs, flash memories, or forms of EPROM or EEPROM. The instructions may be executed to support one or more aspects of the functionality described in this disclosure.

In addition, in some respects, the functionality described herein may be provided within dedicated hardware and/or software modules. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components. Also, the techniques may be fully implemented in one or more circuits or logic elements.

What is claimed is:

1. A method comprising:

transitioning alkali atoms in a vapor cell, via electromagnetic (EM) radiation of one or more frequencies, from a first quantum state to a Rydberg state via at least two intermediary quantum states, wherein each of the at least two intermediary quantum states has an energy state between the first quantum state and the Rydberg state, wherein the alkali atoms in the Rydberg state have an orbital angular momentum quantum number that is at least a number of quanta of the one or more frequencies;

detecting a response of the alkali atoms in the Rydberg state to incident EM radiation; and outputting a signal proportional to the detected response.

2. The method of claim 1, wherein the orbital angular momentum quantum number is at least 3 (l≥3).

3. The method of claim 1, wherein a principal quantum number of the alkali atoms in the Rydberg state is less than or equal to 200 (n≤200).

4. The method of claim 1, wherein transitioning the alkali atoms in the vapor cell from the first quantum state to the Rydberg state comprises:

transitioning the alkali atoms, via EM radiation comprising a first frequency, from the first quantum state to a second quantum state, the second quantum state being a lower energy state than the Rydberg state, and where the first frequency is configured to be a frequency between the first quantum state and second quantum state;

transitioning the alkali atoms, via EM radiation comprising a second frequency, from the second quantum state to a third quantum state, the third quantum state being a lower energy state than the Rydberg state, and where the second frequency is configured to be a frequency between the second quantum state and third quantum state;

transitioning the alkali atoms, via EM radiation comprising a third frequency, from the third quantum state to a fourth quantum state, the fourth quantum state being a lower energy state than the Rydberg state, and where the third frequency is configured to be a frequency between the third quantum state and fourth quantum state; and transitioning the alkali atoms, via EM radiation comprising a fourth frequency, from the fourth quantum state to the Rydberg state, and where the fourth frequency is configured to be a frequency between the fourth quantum state and the Rydberg state.

5. The method of claim 4, wherein the first frequency is a visible or a near-infrared (NIR) frequency, wherein the second frequency is a visible frequency, wherein the third frequency is at least 1 gigahertz (GHz) and less than 1 terahertz (THz), and wherein the fourth frequency is at least 10 megahertz (MHz) and less than 100 GHz, and wherein each of the first and second frequencies are different from each other.

6. The method of claim 4, wherein the first frequency is a visible or an NIR frequency, wherein the second frequency is an NIR frequency, wherein the third frequency is an NIR frequency, wherein the fourth frequency is at least 10 MHz and less than 100 GHz, and wherein each of the first, second, and third frequencies are different from each other.

7. The method of claim 4, wherein the first frequency is a visible or an NIR frequency, wherein the second frequency is an NIR frequency, wherein the third frequency is an NIR frequency, wherein the fourth frequency is an NIR frequency, and wherein each of the first, second, third, and fourth frequencies are different from each other.

8. The method of claim 4, further comprising:
tuning, via an electric field applied to at least a portion of the volume of the vapor cell, at least one resonant frequency between at least one of the first, second, third, fourth, and Rydberg states.

9. The method of claim 6, wherein EM radiation comprising at least three of the first, second, third, or fourth frequencies is arranged in a Doppler-free configuration such that three or more k-vectors of EM radiation comprising at least three of the first, second, third, or fourth frequencies are balanced at relative angles and a total Doppler shift k·v equals zero along at least two orthogonal directions.

10. The method of claim 1, where detecting a response of the alkali atoms in the Rydberg state to incident EM radiation comprises at least one of detecting a change in electromagnetic induced transparency (EIT) of the alkali atoms for the EM radiation of at least one of the one or more frequencies, detecting a signal correlated to a change in the current of an electrical circuit in response to the change in the ionization of the vapor of alkali atoms, or detecting a fluorescence of the alkali atoms.

11. A sensor, comprising:
a vapor cell including a vapor of alkali atoms;
a system configured to direct electromagnetic (EM) radiation of one or more frequencies into the vapor cell and incident on the vapor of alkali atoms, wherein the EM radiation of one or more frequencies is configured to transition the alkali atoms from a first quantum state to a Rydberg state via at least two intermediary quantum states, wherein each of the at least two intermediary quantum states has an energy state between the first quantum state and the Rydberg state, wherein the alkali atoms in the Rydberg state comprise an orbital angular momentum quantum number that is at least a number of quanta of the one or more frequencies; and
a detector configured to detect a response of the alkali atoms to incident EM radiation after the alkali atoms are prepared in transitioned to the Rydberg state.

12. The sensor of claim 11, wherein the orbital angular momentum quantum number is at least 3 (l≥3).

13. The sensor of claim 11, wherein a principal quantum number of the alkali atoms in the Rydberg state is less than or equal to 200 (n≤200).

14. The sensor of claim 11, wherein EM radiation of one or more frequencies comprises:
EM radiation of a first frequency configured to be at a frequency between the first quantum state and a second quantum state, wherein the second quantum state is a lower energy state than the Rydberg state;
EM radiation of a second frequency configured to be at a frequency between the second quantum state and a third quantum state, wherein the third quantum state is a lower energy state than the Rydberg state;
EM radiation of a third frequency configured to be at a frequency between the third quantum state and a fourth quantum state, wherein the fourth quantum state is a lower energy state than the Rydberg state; and
EM radiation of a fourth frequency configured to be at a frequency between the fourth quantum state and the Rydberg state.

15. The sensor of claim 14, wherein the first frequency is a visible or a near-infrared (NIR) frequency, wherein the second frequency is a visible frequency, wherein the third frequency is at least 1 gigahertz (GHz) and less than 1 terahertz (THz), and wherein the fourth frequency is at least 10 megahertz (MHz) and less than 100 GHz, and wherein each of the first and second frequencies are different from each other.

16. The sensor of claim 14, wherein the first frequency is a visible or an NIR frequency, wherein the second frequency is an NIR frequency, wherein the third frequency is an NIR frequency, wherein the fourth frequency is at least 10 MHz and less than 100 GHz, and wherein each of the first, second, and third frequencies are different from each other.

17. The sensor of claim 14, wherein the first frequency is a visible or an NIR frequency, wherein the second frequency is an NIR frequency, wherein the third frequency is an NIR frequency, wherein the fourth frequency is an NIR frequency, and wherein each of the first, second, third, and fourth frequencies are different from each other.

18. The sensor of claim 11, wherein the detector is configured to detect at least one of a fluorescence of the alkali atoms, a signal correlated to a change in a current of an electrical circuit in response to a change in the ionization of the vapor of alkali atoms, or a change in electromagnetic induced transparency (EIT) of the alkali atoms for the EM radiation of the first frequency.

19. A sensor, comprising:
a vapor cell including a vapor of alkali atoms;
a first set of optical elements configured to substantially collimate and direct a first electromagnetic (EM) radiation comprising visible light to be incident on at least a portion the alkali atoms of the vapor cell;
a second set of optical elements configured to substantially collimate and direct a second EM radiation comprising visible or near infrared (NIR) light to be incident on at least a portion the alkali atoms of the vapor cell;
a third set of optical elements configured to substantially collimate and direct a third EM radiation comprising visible light, NIR light, or EM radiation comprising a frequency that is at least 1 gigahertz (GHz) and less than 1 terahertz (THz) to be incident on at least a portion the alkali atoms of the vapor cell;
a fourth set of optical elements configured to substantially collimate and direct a fourth EM radiation comprising visible light, NIR light, or EM radiation comprising a frequency that is at least 10 megahertz (MHz) and less than 100 GHz to be incident on at least a portion the alkali atoms of the vapor cell; and a detector configured to detect a response of the alkali atoms to incident EM radiation that is different from the first, second, third, and fourth EM radiations after the alkali atoms are prepared in the Rydberg state, wherein the first, second, third, and fourth EM radiations are configured to prepare at least a portion of the alkali atoms from a first quantum state to a Rydberg state, wherein the alkali atoms prepared in the Rydberg state comprise an orbital angular momentum quantum number is at least 3 ($l \geq 3$) and a principal quantum number less than 200 ($n \leq 200$).

20. The sensor of claim 19, wherein the first, second, and third sets of optical elements each comprise at least one of a mirror, a lens, a diffraction grating, a metasurface, or a waveguide.

\* \* \* \* \*